US012648349B2

(12) United States Patent
Nienhaus

(10) Patent No.: US 12,648,349 B2
(45) Date of Patent: Jun. 2, 2026

(54) PEROVSKITE-SENSITIZED NEAR-INFRARED-TO-GREEN UPCONVERSION

(71) Applicant: Florida State University Research Foundation, Inc., Tallahassee, FL (US)

(72) Inventor: Lea Nienhaus, Tallahassee, FL (US)

(73) Assignee: Florida State University Research Foundation, Inc., Tallahassee, FL (US)

( * ) Notice: Subject to any disclaimer, the term of this patent is extended or adjusted under 35 U.S.C. 154(b) by 383 days.

(21) Appl. No.: 18/471,987

(22) Filed: Sep. 21, 2023

(65) Prior Publication Data

US 2024/0122062 A1      Apr. 11, 2024

Related U.S. Application Data

(60) Provisional application No. 63/411,177, filed on Sep. 29, 2022.

(51) Int. Cl.
| | |
|---|---|
| *H10K 85/50* | (2023.01) |
| *H10K 30/50* | (2023.01) |
| *H10K 50/11* | (2023.01) |
| *H10K 85/60* | (2023.01) |
| *H10K 101/60* | (2023.01) |

(52) U.S. Cl.
CPC ............. *H10K 85/50* (2023.02); *H10K 30/50* (2023.02); *H10K 50/11* (2023.02); *H10K 85/626* (2023.02); *H10K 2101/60* (2023.02)

(58) Field of Classification Search
CPC ...... H10K 85/50; H10K 85/626; H10K 30/50; H10K 50/11; H10K 2101/60; H10K 30/20; H10K 50/121; H10K 85/615; H10K 85/622; H10K 85/625
USPC ......................................................... 257/40
See application file for complete search history.

(56) References Cited

U.S. PATENT DOCUMENTS

| | | | | |
|---|---|---|---|---|
| 10,052,393 | B2 * | 8/2018 | Park | A61K 33/244 |
| 2021/0036249 | A1 * | 2/2021 | Nienhaus | H10K 30/30 |
| 2022/0064526 | A1 * | 3/2022 | Jang | C09K 11/02 |

* cited by examiner

*Primary Examiner* — Monica D Harrison
(74) *Attorney, Agent, or Firm* — Thomas | Horstemeyer, LLP

(57)      ABSTRACT

In one aspect, the disclosure a system for near infrared-to-green upconversion of light in solid-state optoelectronic devices, the system comprising a bulk semiconductor layer capable of absorbing a near-infrared first wavelength of light and an organic annihilator in contact with the bulk semiconductor, wherein the organic annihilator is capable of upconversion via triplet-triplet annihilation from triplet states in the organic annihilator to produce green light at a second wavelength. In one aspect, the bulk semiconductor can be a formamidinium-based metal halide perovskite and the organic annihilator can be a polycyclic aromatic hydrocarbon or derivative thereof. Also disclosed are devices incorporating the same and methods for upconverting near infrared light to green light.

18 Claims, 18 Drawing Sheets

PEROVSKITE-SENSITIZED NEAR-INFRARED-TO-GREEN UPCONVERSION

CROSS-REFERENCE TO RELATED APPLICATIONS

This application claims the benefit of U.S. Provisional Application No. 63/411,177, filed on Sep. 29, 2022, which is incorporated herein by reference in its entirety.

BACKGROUND

Perovskite-sensitized triplet fusion upconversion (UC) via triplet-triplet annihilation (TTA) first emerged in 2019. Since its inception, focus has been placed primarily on understanding the mechanism of triplet generation and role of the fabrication conditions on the device performance. High absorption cross sections and long charge carrier diffusion lengths in the perovskite sensitizer in addition to the underlying triplet sensitization mechanism based on free charge carrier injection to the bound triplet state of the annihilator promise a path towards the realization of efficient solid-state UC devices. However, to date, the only triplet annihilator that has been successfully paired with bulk perovskites in the solid state and reported in bulk lead halide perovskite-sensitized UC has been rubrene, allowing for near-infrared-to-yellow UC.

Rubrene has long been the "gold standard" of solid-state near-infrared-to-visible UC due to its known high UC efficiencies in solution as well as solid state configurations. However, the inherent ~0.4 eV energy loss caused by the mismatched energy alignment between the perovskite bandgap (1.55 eV) and triplet energy ($T_1$=1.14 eV) negates the benefits of using a sensitizer that does not rely on intersystem crossing to generate the prerequisite triplet states. The resulting small apparent anti-Stokes shift from 800 nm (1.55 eV) to 605 nm (2.05 eV) in the case of rubrene doped with ~1% dibenzotetraphenylperiflanthene (DBP) is far from optimized. In the ideal case, the TTA-UC process should be able to double the triplet energy where $E(S_1)=E(2T_1)$ or achieve an apparent anti-Stokes shift equal to the triplet energy $E(T_1)$. Hence, even when allowing for small energy losses in the TTA processes, achieving upconverted emission around 450 nm (2.8 eV) would be preferable when using the established formamidinium methylammonium lead triiodide ($FA_{0.85}MA_{0.15}PbI_3$, FAMA) with a band gap of 1.55 eV as the triplet sensitizer.

In this desired triplet energy regime, anthracene and other polycyclic aromatic hydrocarbons and derivatives thereof are of general interest as these allow an increase in triplet energy and reduced energy losses during hole extraction due to generally deeper highest occupied molecular orbital (HOMO) energy levels. While 9,10-diphenylanthracene (DPA) is the common workhorse in solution-phase visible-to-blue UC, it is incompatible with the FAMA sensitizer used here due to its high triplet energy level ($T_1$=1.77 eV) and strong excimer formation reduces the achievable UC yield and apparent anti-Stokes shift in solid state. However, the green dye 1-chloro-9,10-bis(phenylethynyl) anthracene (1-CBPEA) commercially used in glowsticks has been reported as an efficient triplet annihilator, with peak emission at 490 nm (2.53 eV) in solution. Castellano and co-workers have successfully demonstrated TTA-UC using 2-chloro-9,10-bis(phenylethynyl) anthracene (2-CBPEA), which has similar optical properties as 1-CBPEA and a FAMA-compatible triplet energy level of $T_1$<1.61 eV. Previous reports have given a triplet energy for 1-CBPEA of $T_1$=1.20 eV, which is at odds with the efficient TTA-UC observed in solution as the requirement of $E(S_1) \leq E(2T_1)$ is not fulfilled. While slightly endothermic UC is in principle possible, it is hypothesized 1-CBPEA could have a marginally higher native triplet energy level in the range of $T_1$=1.3–1.2 eV, estimated at roughly half of the singlet energy $S_1$. However, effects on the singlet and triplet energy surfaces caused by intermolecular coupling in solid state cannot be ruled out; this effect has previously observed for the parent molecule 9,10-bis(phenyl ethynyl)anthracene (BPEA), where different molecular arrangements influence the singlet and triplet energy levels.

However, considering the 1.55 eV bandgap of the lead iodide perovskite sensitizer, the ideal annihilator would have a triplet energy of ~1.5 eV, yielding the optimal upconverted emission at ~3.0 eV while still allowing for a small driving force for electron transfer for triplet generation.

Despite advances in solid-state perovskite-sensitized photon upconversion research, thus far only a single annihilator—rubrene—has thus far been successfully paired with the perovskite sensitizer. Furthermore, the inherent energetic mismatch between the perovskite bandgap and the rubrene triplet energy has restricted the apparent anti-Stokes shift achievable in the upconversion process. What is needed is one or more additional annihilators having triplet levels that can be successfully sensitized using the established formamidinium methylammonium lead triiodide perovskite, resulting in upconverted emission at peak emission wavelengths higher than those currently achievable. These needs and other needs are satisfied by the present disclosure.

SUMMARY

In accordance with the purpose(s) of the present disclosure, as embodied and broadly described herein, the disclosure, in one aspect, relates to a system for near infrared-to-green upconversion of light in solid-state optoelectronic devices, the system comprising a bulk semiconductor layer capable of absorbing a near-infrared first wavelength of light and an organic annihilator in contact with the bulk semiconductor, wherein the organic annihilator is capable of upconversion via triplet-triplet annihilation from triplet states in the organic annihilator to produce green light at a second wavelength. In one aspect, the bulk semiconductor can be a formamidinium-based metal halide perovskite and the organic annihilator can be a polycyclic aromatic hydrocarbon or derivative thereof. Also disclosed are devices incorporating the same and methods for upconverting near infrared light to green light.

Other systems, methods, features, and advantages of the present disclosure will be or become apparent to one with skill in the art upon examination of the following drawings and detailed description. It is intended that all such additional systems, methods, features, and advantages be included within this description, be within the scope of the present disclosure, and be protected by the accompanying claims. In addition, all optional and preferred features and modifications of the described embodiments are usable in all aspects of the disclosure taught herein. Furthermore, the individual features of the dependent claims, as well as all optional and preferred features and modifications of the described embodiments are combinable and interchangeable with one another.

BRIEF DESCRIPTION OF THE DRAWINGS

Many aspects of the present disclosure can be better understood with reference to the following drawings. The components in the drawings are not necessarily to scale, emphasis instead being placed upon clearly illustrating the principles of the present disclosure. Moreover, in the drawings, like reference numerals designate corresponding parts throughout the several views.

FIG. 1A: UV-visible absorbance spectra of RubDBP and 1-CBPEA, where a redshifted aggregation-induced absorption feature can be seen at 520 nm. FIG. 1B: Emission spectra of the OSC films. 1-CBPEA emits at 550 nm and RubDBP is dominated by DBP emission at 605 nm. Absorption spectra at selected delay times for RubDBP (FIG. 1C) and 1-CBPEA (FIG. 1D) thin films. The relevant spectral features are identified for both OSC films. Rubrene exhibits the characteristic $S_1$ excited state absorption (ESA) at 445 nm and $T_1$ ESA features at 485 nm and 515 nm and a bleach corresponding to DBP is observed at 600 nm. Two bleaches are found for 1-CBPEA, which is attributed to the ground state bleach (GSB) and stimulated emission at 440 nm and 530 nm. The the $T_1$ ESA is at 470 nm and 510 nm. Pump laser scatter is denoted by the gray box.

In FIG. 4B, both the Rub $T_1$ and polaron signatures are present at 520 nm and 550 nm signifying successful triplet sensitization. The $T_1 \rightarrow T_n$ transitions at 460 nm and 510 nm for 1-CBPEA are highlighted in FIG. 4C. All TA measurements were taken under 700 nm pump. FIG. 4D: UC emission for the bilayer films with photos of the corresponding bilayer films under 780 nm excitation.

Figure 1A:
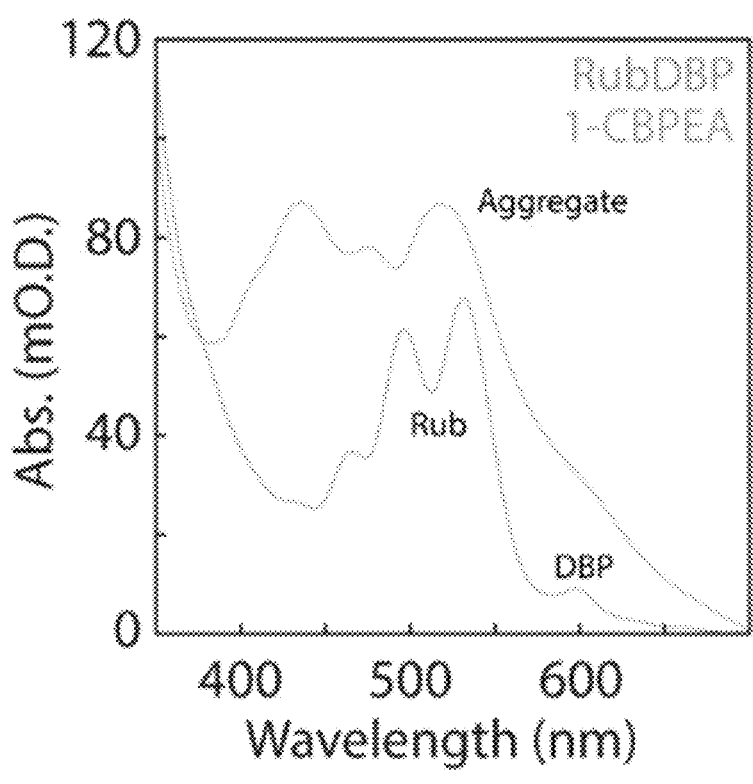
FIGS. 1A-1D show a comparison of the RubDBP and 1-CBPEA organic semiconductor (OSC) thin films.
Figure 1B:
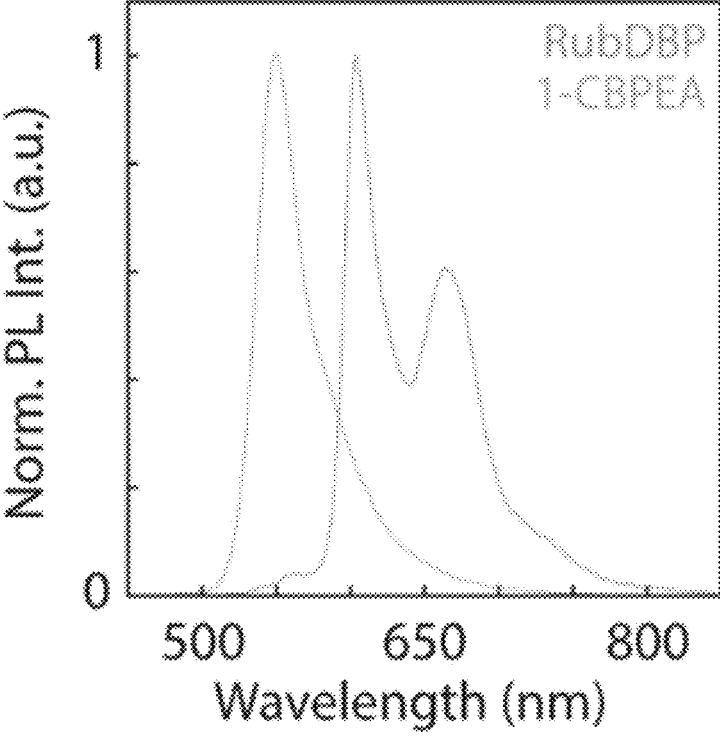
Figure 1C:
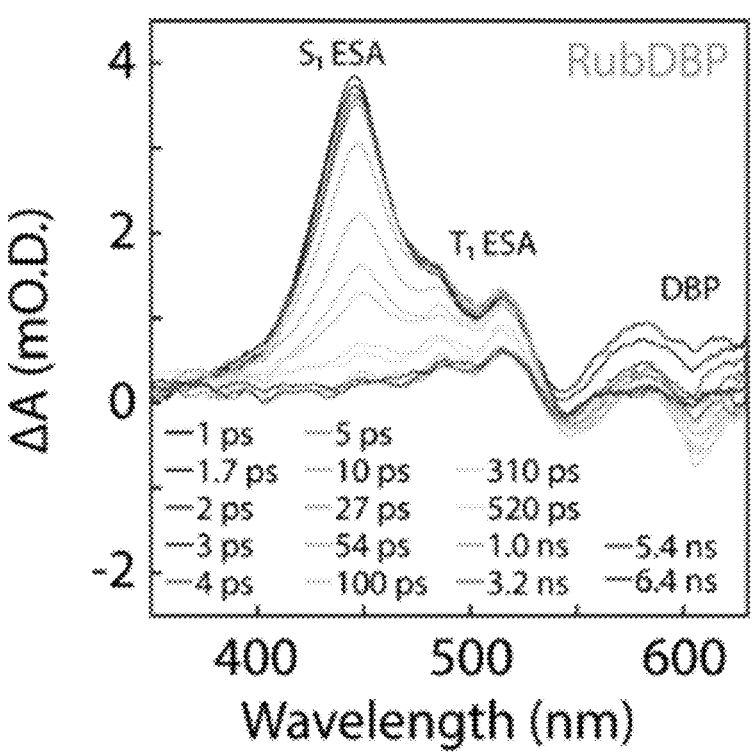
Figure 1D:
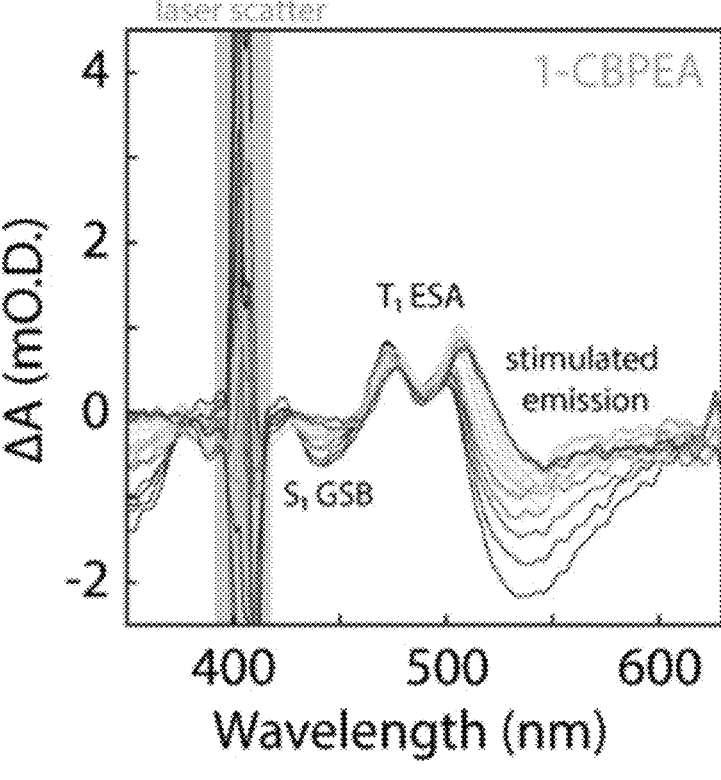

Additional advantages of the invention will be set forth in part in the description which follows, and in part will be obvious from the description, or can be learned by practice of the invention. The advantages of the invention will be realized and attained by means of the elements and combinations particularly pointed out in the appended claims. It is to be understood that both the foregoing general description and the following detailed description are exemplary and explanatory only and are not restrictive of the invention, as claimed.

DETAILED DESCRIPTION

Disclosed herein are perovskite devices making use of new polycyclic aromatic hydrocarbon-derived annihilators such as 1-chloro-9,10-bis(phenylethynyl) anthracene (1-CBPEA) and naphtho[2,3-a]pyrene (NaPy). It has been found that FAMA perovskites can act as a triplet sensitizer for 1-CBPEA, highlighting the fact that triplet generation at the perovskite/organic semiconductor (OSC) interface is a general phenomenon and not limited to rubrene.

In one aspect, disclosed herein is a system for near infrared-to-green upconversion of light in a solid-state optoelectronic device, the system including at least a bulk semiconductor layer capable of absorbing a near-infrared first wavelength of light and an organic annihilator in contact with the bulk semiconductor, wherein the organic annihilator is capable of upconversion via triplet-triplet annihilation from triplet states in the organic annihilator to produce green light at a second wavelength. In another aspect, exposing the bulk semiconductor to light at the first wavelength creates free charge carriers by promoting electrons from a valence band of the bulk semiconductor to a conduction band of the bulk semiconductor, resulting in holes in the valence band. In still another aspect, the triplet states of the organic annihilator are capable of being populated by charge transfer from the free charge carriers generated in the bulk semiconductor.

In one aspect, the first wavelength can be between about 650 nm and about 1200 nm, or can be about 750, 760, 770, 780, 790, 800, 810, 820, 830, 840, 850, 860, 870, 880, 890, 900, 910, 920, 930, 940, 950, 960, 970, 980, 990, 1000, 1050, 1100, 1150 or about 1200, or a combination of any of the foregoing values, or a range encompassing any of the foregoing values, where any value can be an upper or lower endpoint of the range.

In another aspect, the organic annihilator can be a solid. In still another aspect, the bulk semiconductor can be a film having a thickness of from about 10 nm to about 500 nm, or of about 30, 35, 40, 45, 50, 55, 60, 65, 70, 75, 80, 85, 90, 95, 100, 150, 200, 250, 300, 350, 400, 450, or about 500 nm, or a combination of any of the foregoing values, or a range encompassing any of the foregoing values, where any value can be an upper or lower endpoint of the range. In some aspects, the system can be a bilayer device having a bulk semiconductor layer in contact with an organic annihilator layer. In one aspect, in the system, upconversion occurs at or within 100 nm of an interface between the bulk semiconductor layer and the organic annihilator layer. In some aspects, upconversion occurs within about 5, 10, 20, 40, 60, 80, or about 100 nm of an interface, or a combination of any of the foregoing values, or a range encompassing any of the foregoing values, where any value can be an upper or lower endpoint of the range.

In one aspect, the bulk semiconductor can be an organic or inorganic metal halide perovskite, a cadmium telluride, an indium phosphide, an indium gallium arsenide, a cadmium indium gallium selenide, a transition metal dichalcogenide, or a combination thereof. In another aspect, the organic or inorganic metal halide perovskite can be a lead triiodide, a lead tribromide, or a mixed tri(bromide/iodide) halide perovskite. In still another aspect, the organic metal halide perovskite can be a methylammonium-based metal halide perovskite, a formamidinium-based metal halide perovskite, a cesium-based metal halide perovskite, or a combination thereof. In one aspect, the transition metal dichalcogenide can be molybdenum disulfide or tungsten disulfide.

In another aspect, the bulk semiconductor can have a bandgap of from about 1.0 eV to about 1.9 eV, or of about 1.55 eV, or can have a bandgap of about 1.0, 1.1, 1.2, 1.3, 1.4, 1.5, 1.6, 1.7, 1.8 or about 1.9 eV, or a combination of any of the foregoing values, or a range encompassing any of the foregoing values, where any value can be an upper or lower endpoint of the range. In one aspect, the bulk semiconductor has a bandgap within about 10% of the lowest triplet energy of the organic annihilator. In another aspect, the lowest triplet energy of the organic annihilator is from about 1.7 eV to about 1.15 eV, or is about 1.7, 1.65, 1.6, 1.55, 1.5, 1.45, 1.4, 1.35, 1.3, 1.25, 1.2, or about 1.15 eV, or a combination of any of the foregoing values, or a range encompassing any of the foregoing values, where any value can be an upper or lower endpoint of the range. In still another aspect, the lowest triplet energy of the organic annihilator is less than about 1.61 eV. In another aspect, the singlet energy must be roughly equal to less than twice the triplet energy.

In still another aspect, the first wavelength can be from about 200 nm to about 400 nm greater than the second wavelength, or can be about 200, 205, 210, 220, 225, 230, 235, 240, 245, 250, 255, 260, 265, 270, 275, 280, 285, 290, 295, 300, 305, 310, 315, 320, 325, 330, 335, 340, 345, 350, 355, 360, 365, 370, 375, 380, 385, 390, 395, or about 400 nm, or a combination of any of the foregoing values, or a range encompassing any of the foregoing values, where any value can be an upper or lower endpoint of the range.

In one aspect, the organic annihilator can be a polycyclic aromatic hydrocarbon (PAH) or a derivative thereof. In a further aspect, the PAH or derivative thereof can be an anthracene derivative. In another aspect, the organic annihilator can be 1-chloro-9,10-bis(phenylethynyl) anthracene (1-CBPEA). In an alternative aspect, the organic annihilator can be naphtho[2,3-a]pyrene (NaPy). In still another aspect, the organic annihilator can be substantially free of a guest (emitter) material.

Also disclosed herein are devices incorporating the disclosed systems. In one aspect, the device can be a solar cell, a sensor, a light-emitting diode, or any combination thereof. Furthermore, disclosed herein are methods for upconverting near infrared light to green light using the disclosed systems and devices. In one aspect, perovskite-sensitized upconversion can increase the efficiency of solar cells and other devices such as, for example, by harvesting additional infrared light, photocatalysis, infrared sensing, and the like.

Many modifications and other embodiments disclosed herein will come to mind to one skilled in the art to which the disclosed compositions and methods pertain having the benefit of the teachings presented in the foregoing descriptions and the associated drawings. Therefore, it is to be understood that the disclosures are not to be limited to the specific embodiments disclosed and that modifications and other embodiments are intended to be included within the scope of the appended claims. The skilled artisan will recognize many variants and adaptations of the aspects described herein. These variants and adaptations are intended to be included in the teachings of this disclosure and to be encompassed by the claims herein.

Although specific terms are employed herein, they are used in a generic and descriptive sense only and not for purposes of limitation.

As will be apparent to those of skill in the art upon reading this disclosure, each of the individual embodiments described and illustrated herein has discrete components and features which may be readily separated from or combined with the features of any of the other several embodiments without departing from the scope or spirit of the present disclosure.

Any recited method can be carried out in the order of events recited or in any other order that is logically possible. That is, unless otherwise expressly stated, it is in no way intended that any method or aspect set forth herein be construed as requiring that its steps be performed in a specific order. Accordingly, where a method claim does not specifically state in the claims or descriptions that the steps are to be limited to a specific order, it is no way intended that an order be inferred, in any respect. This holds for any possible non-express basis for interpretation, including matters of logic with respect to arrangement of steps or operational flow, plain meaning derived from grammatical organization or punctuation, or the number or type of aspects described in the specification.

All publications mentioned herein are incorporated herein by reference to disclose and describe the methods and/or materials in connection with which the publications are cited. The publications discussed herein are provided solely for their disclosure prior to the filing date of the present application. Nothing herein is to be construed as an admission that the present invention is not entitled to antedate such publication by virtue of prior invention. Further, the dates of publication provided herein can be different from the actual publication dates, which can require independent confirmation.

While aspects of the present disclosure can be described and claimed in a particular statutory class, such as the system statutory class, this is for convenience only and one of skill in the art will understand that each aspect of the present disclosure can be described and claimed in any statutory class.

It is also to be understood that the terminology used herein is for the purpose of describing particular aspects only and is not intended to be limiting. Unless defined otherwise, all technical and scientific terms used herein have the same meaning as commonly understood by one of ordinary skill in the art to which the disclosed compositions and methods belong. It will be further understood that terms, such as those defined in commonly used dictionaries, should be interpreted as having a meaning that is consistent with their meaning in the context of the specification and relevant art and should not be interpreted in an idealized or overly formal sense unless expressly defined herein.

Prior to describing the various aspects of the present disclosure, the following definitions are provided and should be used unless otherwise indicated. Additional terms may be defined elsewhere in the present disclosure.

Definitions

As used herein, "comprising" is to be interpreted as specifying the presence of the stated features, integers, steps, or components as referred to, but does not preclude the presence or addition of one or more features, integers, steps, or components, or groups thereof. Moreover, each of the terms "by", "comprising," "comprises", "comprised of," "including," "includes," "included," "involving," "involves," "involved," and "such as" are used in their open, non-limiting sense and may be used interchangeably. Further, the term "comprising" is intended to include examples and aspects encompassed by the terms "consisting essentially of" and "consisting of." Similarly, the term "consisting essentially of" is intended to include examples encompassed by the term "consisting of.

As used in the specification and the appended claims, the singular forms "a," "an" and "the" include plural referents unless the context clearly dictates otherwise. Thus, for example, reference to "a perovskite," "a wavelength," or "an annihilator," include, but are not limited to, mixtures, combinations, and/or ranges of two or more such perovskites, wavelengths, or annihilators, and the like.

It should be noted that ratios, concentrations, amounts, and other numerical data can be expressed herein in a range format. It will be further understood that the endpoints of each of the ranges are significant both in relation to the other endpoint, and independently of the other endpoint. It is also understood that there are a number of values disclosed herein, and that each value is also herein disclosed as "about" that particular value in addition to the value itself. For example, if the value "10" is disclosed, then "about 10" is also disclosed. Ranges can be expressed herein as from "about" one particular value, and/or to "about" another particular value. Similarly, when values are expressed as approximations, by use of the antecedent "about," it will be understood that the particular value forms a further aspect. For example, if the value "about 10" is disclosed, then "10" is also disclosed.

When a range is expressed, a further aspect includes from the one particular value and/or to the other particular value. For example, where the stated range includes one or both of the limits, ranges excluding either or both of those included limits are also included in the disclosure, e.g. the phrase "x to y" includes the range from 'x' to 'y' as well as the range greater than 'x' and less than 'y'. The range can also be expressed as an upper limit, e.g. 'about x, y, z, or less' and should be interpreted to include the specific ranges of 'about x', 'about y', and 'about z' as well as the ranges of 'less than x', less than y', and 'less than z'. Likewise, the phrase 'about x, y, z, or greater' should be interpreted to include the specific ranges of 'about x', 'about y', and 'about z' as well as the ranges of 'greater than x', greater than y', and 'greater than z'. In addition, the phrase "about 'x' to 'y'", where 'x' and 'y' are numerical values, includes "about 'x' to about 'y'".

It is to be understood that such a range format is used for convenience and brevity, and thus, should be interpreted in a flexible manner to include not only the numerical values explicitly recited as the limits of the range, but also to include all the individual numerical values or sub-ranges encompassed within that range as if each numerical value and sub-range is explicitly recited. To illustrate, a numerical range of "about 0.1% to 5%" should be interpreted to include not only the explicitly recited values of about 0.1% to about 5%, but also include individual values (e.g., about 1%, about 2%, about 3%, and about 4%) and the sub-ranges (e.g., about 0.5% to about 1.1%; about 5% to about 2.4%; about 0.5% to about 3.2%, and about 0.5% to about 4.4%, and other possible sub-ranges) within the indicated range.

As used herein, the terms "about," "approximate," "at or about," and "substantially" mean that the amount or value in question can be the exact value or a value that provides equivalent results or effects as recited in the claims or taught herein. That is, it is understood that amounts, sizes, formulations, parameters, and other quantities and characteristics are not and need not be exact, but may be approximate and/or larger or smaller, as desired, reflecting tolerances, conversion factors, rounding off, measurement error and the like, and other factors known to those of skill in the art such that equivalent results or effects are obtained. In some circumstances, the value that provides equivalent results or effects cannot be reasonably determined. In such cases, it is generally understood, as used herein, that "about" and "at or about" mean the nominal value indicated ±10% variation unless otherwise indicated or inferred. In general, an amount, size, formulation, parameter or other quantity or characteristic is "about," "approximate," or "at or about" whether or not expressly stated to be such. It is understood that where "about," "approximate," or "at or about" is used before a quantitative value, the parameter also includes the specific quantitative value itself, unless specifically stated otherwise.

As used herein, the terms "optional" or "optionally" means that the subsequently described event or circumstance can or cannot occur, and that the description includes instances where said event or circumstance occurs and instances where it does not.

As used herein, "triplet-triplet annihilation" or "TTA" refers to an energy transfer mechanism where two molecules in triplet excited states interact, forming both a ground state molecule and a singlet state excited molecule. In an aspect, TTA can be used to facilitate "upconversion" (UC), a process where the energy of two photons is converted to one photon with higher energy than either of the original two. In UC, a sensitizer absorbs a low energy photon and populates a first excited triplet state through "intersystem crossing," a radiationless process wherein a transition occurs between two electronic states having different spin multiplicities (i.e., excitation from a singlet state to a triplet excited state, which involves a "forbidden" spin transition). On the other hand, "singlet fission" or "SF" is a spin-allowed process, where one singlet excited state is converted into two triplet states.

Unless otherwise specified, temperatures referred to herein are based on atmospheric pressure (i.e., one atmosphere).

Now having described the aspects of the present disclosure, in general, the following Examples describe some additional aspects of the present disclosure. While aspects of the present disclosure are described in connection with the following examples and the corresponding text and figures, there is no intent to limit aspects of the present disclosure to this description. On the contrary, the intent is to cover all alternatives, modifications, and equivalents included within the spirit and scope of the present disclosure.

ASPECTS

The present disclosure can be described in accordance with the following numbered Aspects, which should not be confused with the claims.

Aspect 1. A system for near infrared-to-green upconversion of light in a solid-state optoelectronic device, the system comprising a bulk semiconductor layer capable of absorbing a near-infrared first wavelength of light and an organic annihilator in contact with the bulk semiconductor, wherein the organic annihilator is capable of upconversion via triplet-triplet annihilation from triplet states in the organic annihilator to produce green light at a second wavelength.

Aspect 2. The system according to aspect 1, wherein exposing the bulk semiconductor to light at the first wavelength creates free charge carriers by promoting electrons from a valence band of the bulk semiconductor to a conduction band of the bulk semiconductor, resulting in holes in the valence band.

Aspect 3. The system according to aspect 2, wherein the triplet states of the organic annihilator are capable of being populated by charge transfer from the free charge carriers generated in the bulk semiconductor.

Aspect 4. The system according to any one of aspects 1-3, wherein the first wavelength is between about 650 nm and about 1200 nm.

Aspect 5. The system according to any one of aspects 1-4, wherein the organic annihilator is a solid.

Aspect 6. The system according to any one of aspects 1-5, wherein the bulk semiconductor is a film.

Aspect 7. The system of aspect 6, wherein the film has a thickness of about 10 nm to about 500 nm.

Aspect 8. The system according to any one of aspects 1-7, wherein the system comprises a bilayer device comprising a bulk semiconductor layer in contact with an organic annihilator layer.

Aspect 9. The system of aspect 8, wherein upconversion occurs at or within 100 nm of an interface between the bulk semiconductor layer and the organic annihilator layer.

Aspect 10. The system according to any one of aspects 1-9, wherein the bulk semiconductor comprises an organic or inorganic metal halide perovskite, a cadmium telluride, an indium phosphide, an indium gallium arsenide, a cadmium indium gallium selenide, a transition metal dichalcogenide, or a combination thereof.

Aspect 11. The system according to aspect 10, wherein the organic or inorganic metal halide perovskite comprises a lead triiodide, a lead tribromide, or a mixed tri(bromide/iodide) halide perovskite.

Aspect 12. The system according to aspect 10 or aspect 11, wherein the organic metal halide perovskite comprises a methylammonium-based metal halide perovskite, a formamidinium-based metal halide perovskite, a cesium-based metal halide perovskite, or a combination thereof.

Aspect 13. The system of aspect 10, wherein the transition metal dichalcogenide comprises molybdenum disulfide or tungsten disulfide.

Aspect 14. The system according to any one of aspects 1-13, wherein the bulk semiconductor comprises a bandgap of from about 1.0 eV to about 1.9 eV.

Aspect 15. The system of aspect 14, wherein the bulk semiconductor comprises a bandgap of about 1.55 eV.

Aspect 16. The system according to any one of aspects 1-15, wherein the first wavelength is from about 200 nm to about 400 nm greater than the second wavelength.

Aspect 17. The system according to any one of aspects 1-16, wherein the bulk semiconductor has a bandgap within about 10% of a lowest triplet energy of the organic annihilator.

Aspect 18. The system of aspect 17, wherein the lowest triplet energy of the organic annihilator is from about 1.7 to about 1.15 eV.

Aspect 19. The system according to any one of aspects 1-18, wherein the organic annihilator comprises a polycyclic aromatic hydrocarbon (PAH) or a derivative thereof.

Aspect 20. The system according to aspect 19, wherein the PAH or derivative thereof comprises 1-chloro-9,10-bis(phenylethynyl)anthracene (1-CBPEA), naphtho[2,3-a]pyrene (NaPy), or any combination thereof.

Aspect 21. The system according to any one of aspects 1-20, wherein the organic annihilator is substantially free of a guest (emitter) material.

Aspect 22. A device comprising the system of any one of aspects 1-21.

Aspect 23. The device of aspect 22, wherein the device comprises a solar cell, a sensor, a light-emitting diode, or any combination thereof.

Aspect 24. A method for upconverting near infrared light to green light, the method comprising:
(a) exposing a bulk semiconductor layer to a near-infrared first wavelength of light; and (b) upconverting the near-infrared light in an organic annihilator in contact with the bulk semiconductor to green light at a second wavelength.

Aspect 25. The method according to aspect 24, wherein exposing the bulk semiconductor to light at the first wavelength creates free charge carriers by promoting electrons from a valence band of the bulk semiconductor to a conduction band of the bulk semiconductor, resulting in holes in the valence band.

Aspect 26. The method according to aspect 25, wherein triplet states of the organic annihilator are capable of being populated by charge transfer from the free charge carriers in the bulk semiconductor.

Aspect 27. The method according to any one of aspects 24-26, wherein the first wavelength is between about 650 nm and about 1200 nm.

Aspect 28. The method according to any one of aspects 24-27, wherein the bulk semiconductor comprises an organic or inorganic metal halide perovskite, a cadmium telluride, an indium phosphide, an indium gallium arsenide, a cadmium indium gallium selenide, a transition metal dichalcogenide, or a combination thereof.

Aspect 29. The method according to aspect 28, wherein the organic or inorganic metal halide perovskite comprises a lead triiodide, a lead tribromide, or a mixed tri(bromide/iodide) halide perovskite.

Aspect 30. The method according to aspect 28 or aspect 29, wherein the organic metal halide perovskite comprises a methylammonium-based metal halide perovskite, a formamidinium-based metal halide perovskite, a cesium-based metal halide perovskite, or a combination thereof.

Aspect 31. The method of aspect 28, wherein the transition metal dichalcogenide comprises molybdenum disulfide or tungsten disulfide.

Aspect 32. The method according to any one of aspects 24-31, wherein the bulk semiconductor comprises a bandgap of from about 1.0 eV to about 1.9 eV.

Aspect 33. The method of aspect 32, wherein the bulk semiconductor comprises a bandgap of about 1.55 eV.

Aspect 34. The method according to any one of aspects 24-43, wherein the first wavelength is from about 200 nm to about 400 nm greater than the second wavelength.

Aspect 35. The method according to any one of aspects 24-34, wherein the bulk semiconductor has a bandgap within about 10% of a lowest triplet energy of the organic annihilator.

Aspect 36. The method of aspect 35, wherein the lowest triplet energy of the organic annihilator is from about 1.7 eV to about 1.15 eV.

Aspect 37. The method according to any one of aspects 24-36, wherein the organic annihilator comprises a polycyclic aromatic hydrocarbon (PAH) or a derivative thereof.

Aspect 38. The method of aspect 37, wherein the PAH or derivative thereof comprises 1-chloro-9,10-bis(phenylethynyl) anthracene (1-CBPEA), naphtho[2,3-a] pyrene (NaPy), or any combination thereof.

Aspect 39. The method according to any one of aspects 24-38, wherein the organic annihilator is substantially free of a guest (emitter) material.

EXAMPLES

The following examples are put forth so as to provide those of ordinary skill in the art with a complete disclosure and description of how the compounds, compositions, articles, devices and/or methods claimed herein are made and evaluated, and are intended to be purely exemplary of the disclosure and are not intended to limit the scope of what the inventors regard as their disclosure. Efforts have been made to ensure accuracy with respect to numbers (e.g., amounts, temperature, etc.), but some errors and deviations should be accounted for. Unless indicated otherwise, parts are parts by weight, temperature is in ° C. or is at ambient temperature, and pressure is at or near atmospheric.

Example 1: 1-Chloro-9,10-bis(phenylethynyl)anthracene(1-CBPEA)

Device Synthesis

Glass substrates were cleaned via sonication for 15 min in each of the respective solutions: 2% Hellmanex, deionized water, and acetone. Following sonication, the substrates were cleaned by UV-ozone (Ossila) treatment for 15 min. Precursor solutions of $PbI_2$ (1.2 M, TCI), MAI (1.2 M, Dyenamo), and FAI (1.2 M, Dyenamo) were prepared in anhydrous DMF:DMSO (9:1, v/v, Sigma-Aldrich) in a 1:1.09 ratio. The precursor solution was then diluted to 0.24 M (~30 nm) and spin-coated at 1000 rpm for 10 s and 5000 rpm for 30 s. Anhydrous chlorobenzene (Sigma-Aldrich) was used as the antisolvent. The films were then annealed at 210° C. for 30 mins prior to solvent treatment with acetonitrile (Sigma-Aldrich).

Rubrene (Rub, 99.99%, Sigma-Aldrich), dibenzotetraphenyl-periflanthene (DBP, 98%, Sigma-Aldrich), and 1-chloro-9,10-bis(phenylethynyl)anthracene (1-CBPEA, 99%, Sigma-Aldrich) were used without further purification. A 10 mg/mL solution of Rub in anhydrous toluene (Sigma-Aldrich) was prepared and doped with ~1% DBP, similarly a 10 mg/mL solution of 1-CBPEA in anhydrous toluene (Sigma-Aldrich) was prepared. All annihilator solutions were spin-coated onto the perovskite substrates at 6000 rpm for 20 s then annealed at 100° C. for 1 min. Films were encapsulated with a cover slip using a two-part epoxy (Devcon) under an inert nitrogen atmosphere (<0.5 ppm $O_2$) prior to removal from the glovebox.

Steady-State Absorption Spectroscopy

A Thermo Scientific Evolution 220 Spectrophotometer was used to collect the steady-state absorption spectra.

Steady-State Emission Spectroscopy

Direct excitation emission spectra were collected with a 405 nm continuous wave (CVV) laser (LDH-D-C-405, PicoQuant) at a power density of 92 $W/cm^2$ using a 425 nm long-pass filter (Chroma Tech) to remove excess laser scattering. Upconverted emission spectra were taken with a 780 nm CW laser (LDH-D-C-780, PicoQuant) at a power density of 150 $W/cm^2$ using a 700 nm short-pass laser (ThorLabs) to remove laser scatter. An Ocean Insight emission spectrometer (HR2000+ES) was used to collect all spectra.

Time-Resolved Emission Spectroscopy

Perovskite PL decays were measured through time-correlated single photon counting (TCSPC) with a 780 nm picosecond pulsed laser (LDH-D-C-780, PicoQuant) with a 125 kHz repetition frequency at a power density of 44.2 $mW/cm^2$. An 800 nm long-pass filter (ThorLabs) and 780 nm notch (ThorLabs) were used to remove laser scatter as well as isolate the perovskite emission. OSC PL decays were taken under 405 nm picosecond pulsed excitation (LDH-D-C-405, PicoQuant) at a repetition frequency of 1 MHz and power density of 4.97 $W/cm^2$. A 425 nm long pass filter (ThorLabs) was used to remove laser scattering. Upconverted (UC) PL decays were measured under a 780 nm picosecond pulsed laser (LDH-D-C-780, PicoQuant) at a repetition frequency of 50 kHz at a power density of 120 mW/cm$^2$. A combination of a 650 nm short pass (ThorLabs), 700 nm short pass (ThorLabs), and 780 nm notch (Thor-Labs) were used to isolate the UC PL emission and remove scattering. A MultiHarp 150 event timer (PicoQuant) connected to a single-photon avalanche photodiode (Micro Photon Devices) was used to collect photon arrival times for all measurements. Laser powers were measured with a silicon power meter (PM100-D, ThorLabs), and spot sizes were determined using the razor blade method (90:10).

PL Power Dependencies

All power dependent measurements were taken using a 780 nm CW laser (LDH-D-C-780, PicoQuant). Laser powers were measured using a silicon power meter (PM100-D, ThorLabs) and arriving photons were counted for 25 s by a MultiHarp 150 event timer (PicoQuant) with a single-photon photodiode (Micro Photon Devices) connected. For the UC PL power dependencies, both a 780 nm notch filter (Thor-Labs) and 600/40 nm (center/width) band pass filter (Thor-Labs) were used to isolate the UC signal and remove laser scattering. Laser powers were attenuated with neutral density filters (ThorLabs).

Transient Absorption Spectroscopy

A HELIOS Fire transient absorption spectrometer (Ultra-fast Systems) was used for all transient absorption measurements. Femtosecond laser pulses were generated by an Astrella-V-F-1K amplifier where the Vitara-S Coherent Ti:Sapphire laser used was amplified using a 1 kHz Coherent Revolution-50 pump laser. All resulting laser pulses were 5 mJ with a full width half max of 100 fs at 800 nm. Pump and probe beams were directed through an optical parametric amplifier (OperaA Solo, Coherent) and delay stage, respectively. The visible probe (400 nm to 780 nm) was generated via a sapphire crystal for bilayer and perovskite only measurements while a CaF$_2$ crystal generated the ultraviolet probe for the OSC measurements (320 nm to 650 nm). Excess laser scattering was minimized through a dual chopper system, and neutral density filters were used to attenuate pump power. For all measurements, 3 spectra were collected with a 2 second integration time for each delay position with an exponential point collection method starting at 0.01 ps, resulting in a total of 150 points. Perovskite only measurements were taken under 700 nm pump at 4.7 mW, and bilayer films were taken under 700 nm pump with a power of 6.0 mW. A 400 nm pump was used for the OSC measurements at a power of 0.6 mW for both. The TA maps were processed through the Surface Xplorer software package from Ultrafast Systems in addition to MATLAB.

Results and Discussion

The general optical characterization and comparison of 1-CBPEA and rubrene doped with ~1% DBP (RubDBP) OSC thin films are depicted in FIGS. 1A-1D. FIG. 1A shows the absorption spectra of 1-CBPEA and RubDBP. In the latter case, the expected vibronic progression of rubrene is visible, as well as the vibronic feature corresponding to DBP at 600 nm. For 1-CBPEA, in addition to the expected vibronic progression, a broad red shifted feature is found at 520 nm (2.4 eV), which is attributed to an aggregation-induced redshift due to inter-molecular coupling in the solid state. As reported previously, the emission profile of RubDBP (FIG. 1B) is governed by the dopant dye DBP (605 nm), indicating efficient Förster resonance energy transfer (FRET) between rubrene and DBP. The 1-CBPEA emission does not show the vibronic progression observed in solution, rather is dominated by the red-shifted aggregate emission peaking at 550 nm. A comparison of the photoluminescence (PL) intensity normalized by the optical density of the OSC at the excitation wavelength (405 nm) indicates that the PL quantum yield of the RubDBP film is ~1.5 times that of 1-CBPEA.

Transient absorption (TA) spectroscopy gives further insight into the spectral signatures of the singlet and triplet states under direct excitation. Rubrene is known to undergo both SF and TTA, due to its triplet energy $T_1$ at half of the singlet energy $S_1$. Therefore, direct excitation of the RubDBP OSC thin film at 400 nm yields the singlet signature dominated by the $S_1$ excited state absorption (ESA) at 445 nm which rapidly evolves to reveal the $T_1 \rightarrow T_n$ ESA features characteristic of rubrene triplet state at 485 nm and 515 nm. Furthermore, a DBP-related bleach feature can be observed at 605 nm which is attributed to stimulated emission under direct excitation or to the DBP ground state bleach (GSB). It is believed that SF has not been previously reported in 1-CBPEA; however, has been shown in the parent molecule BPEA. Due to the similarity of the TA spectra observed here for 1-CBPEA and previous reports for BPEA, it is suggested that SF also occurs in the 1-CBPEA OSC thin films under direct excitation at 400 nm. In particular, bleach features are found at 440 nm and 530 nm which is attributed to the GSB or stimulated emission of 1-CBPEA. Overlapping ESA features corresponding to the $S_1$ state are found at 470 nm and 500 nm. Additional redshifted ESA features rapidly emerge at 475 nm and 510 nm, which can be attributed to the spin-allowed $T_1 \rightarrow T_n$ optical transitions of triplet states generated by SF on an ultrafast timescale.

Figure 2:
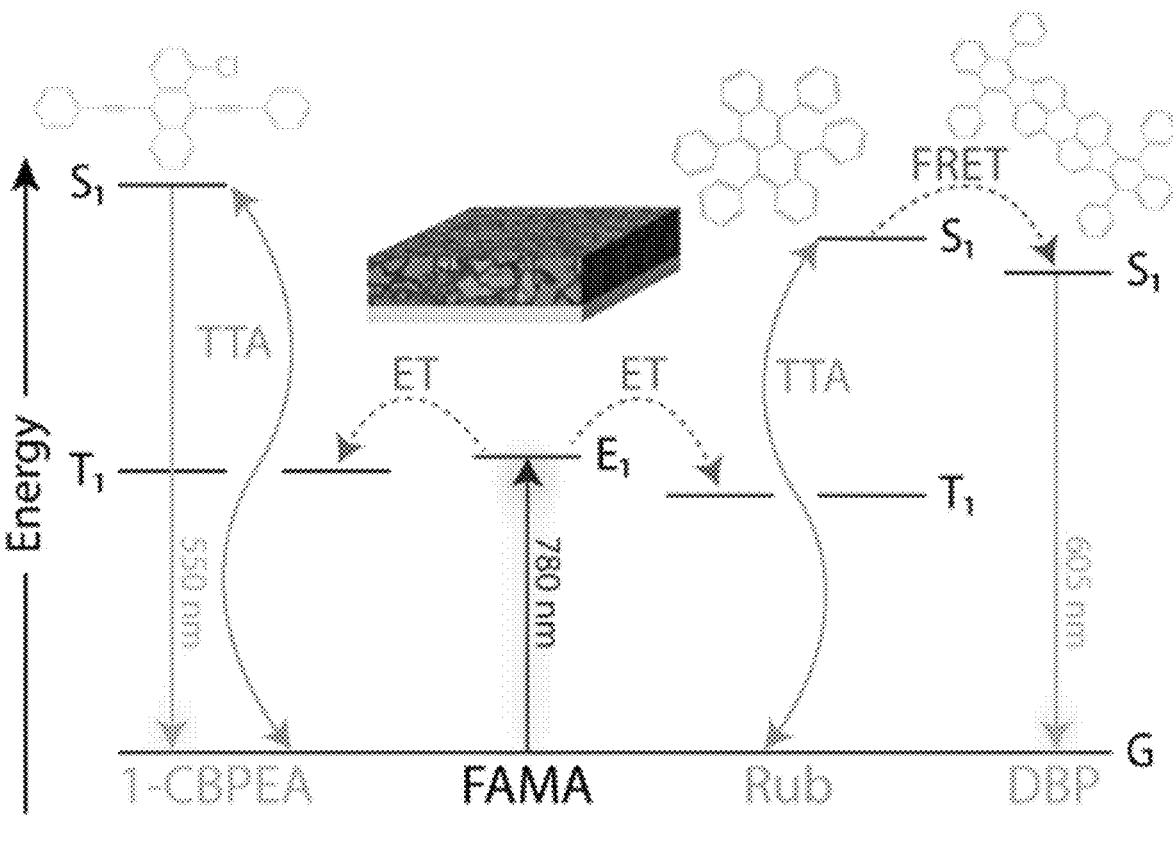
FIG. 2 shows an energy flow schematic for UC process in the bilayer devices with the corresponding chemical structures for the OSC molecules. Incident 780 nm photons are absorbed by the perovskite, where electron transfer (ET) populates the triplet state $T_1$ of 1-CBPEA (left) or Rub (right). Interaction of two triplet states results in TTA, yielding the higher energy $S_1$ state. For Rub, an additional energy transfer (FRET) occurs to the DBP $S_1$ energy level. Resulting UC emission wavelengths are 550 nm for 1-CBPEA and 605 nm for RubDBP.

To investigate the charge extraction at the perovskite/OSC interface and resulting TTA-UC process, bilayer devices consisting of a ~30 nm thin FAMA sensitizer film and either RubDBP or 1-CBPEA as the annihilator were fabricated. The anticipated energy flow resulting in UC in each device is highlighted in FIG. 2. Upon photoexcitation of the perovskite at 780 nm, free charge carriers are generated which transfer to the OSC and recombine to populate the triplet state of either 1-CBPEA or RubDBP. Following triplet generation, two triplets can combine via TTA to yield the desired higher energy singlet state. After creation of the singlet state, the photon can be emitted directly from the $S_1$ state (1-CBPEA) or the higher energy state can be harvested by the DBP dopant (RubDBP) with subsequent emission from the $S_1$ state of DBP.

Figure 3A:
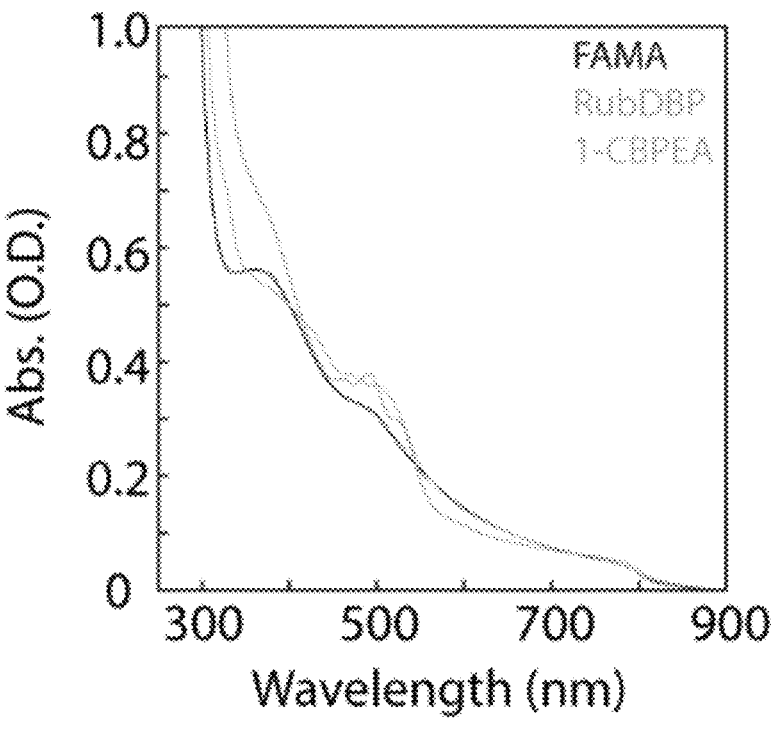
FIG. 3A shows absorption spectra for the FAMA perovskite thin film (black) and bilayer devices (RubDBP: pink, 1-CBPEA: green).
Figure 3B:
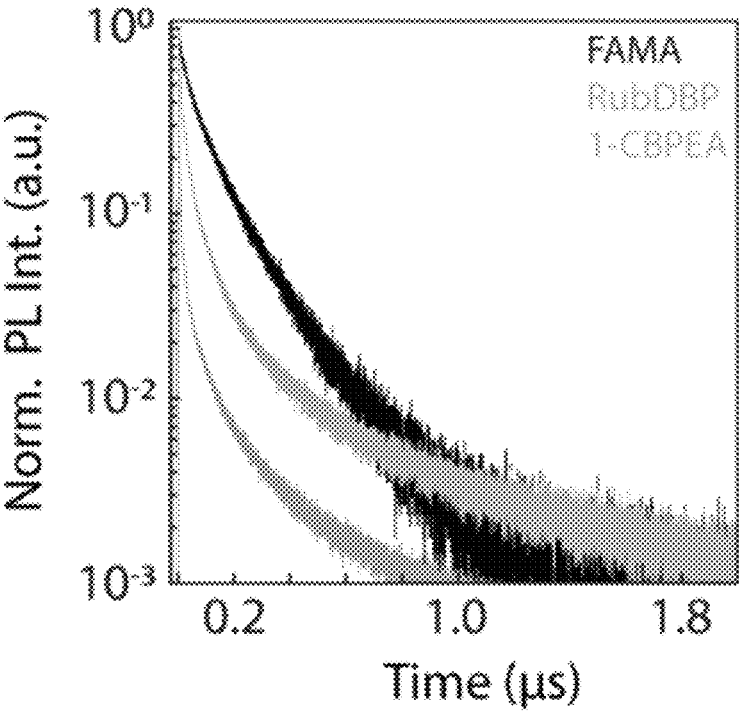
FIG. 3B shows perovskite PL decays for the FAMA and bilayer devices under 780 nm excitation at an excitation density of 44.2 mW/cm². A 780 nm notch filter and an 800 nm long pass filter were used to remove laser scatter and isolate the perovskite emission.

The absorption spectra of the bilayer devices and a FAMA control film are shown in FIG. 3A. The absorption onset of the perovskite is unchanged at 800 nm, and the OSC-related vibronic progression near 500 nm is observed indicating successful fabrication of the bilayers. Further investigation by time-correlated single-photon counting yields information into the charge carrier extraction at the FAMA/OSC interface where the perovskite PL decay dynamics are monitored (>800 nm) under 780 nm excitation (FIG. 3B). In comparison to the FAMA control, both the RubDBP and 1-CBPEA show quenched PL decay dynamics, indicating successful charge extraction. Anthracene derivatives generally have deeper highest occupied molecular orbital (HOMO) levels in comparison to their tetracene analogues. The HOMO of the 1-CBPEA parent molecule BPEA has been reported at −5.49 eV, deeper with respect to the HOMO level of rubrene at −5.4 eV.50 Electron withdrawing groups such as the chlorine in 1-CBPEA, further deepen the HOMO level and simultaneously reduce the bandgap. As a result, the driving force for initial hole extraction from the perovskite valence band to the OSC HOMO to is expected to be inherently reduced in 1-CBPEA in contrast to RubDBP when utilizing the same FAMA perovskite sensitizer composition. Hence, the increased amount of quenching and more rapid PL decay for RubDBP over 1-CBPEA can be attributed to a higher driving force for charge extraction for RubDBP.

Figure 4A:
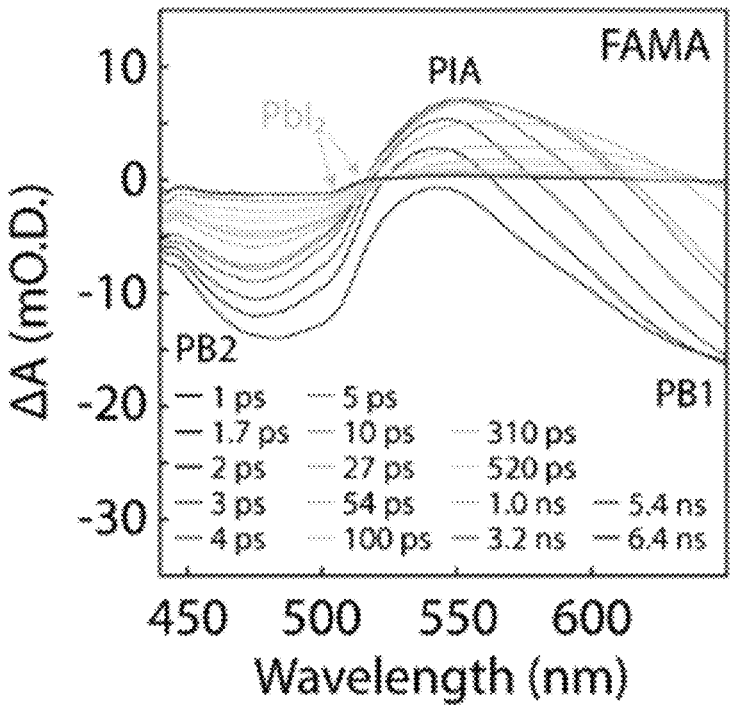
FIGS. 4A-4D show absorption spectra at selected delay times for (FIG. 4A) FAMA, (FIG. 4B) RubDBP, and (FIG. 4C) 1-CBPEA in the spectral range of 440-650 nm showcasing the higher energy perovskite photobleach (PB2) at 495 nm and photoinduced absorption (PIA) at 550 nm. The onset of the ground state bleach PB1 can be seen at 650 nm. Residual $PbI_2$ signals at 510 nm and 520 nm are present in the FAMA only spectra due to surface treatment with acetonitrile to increase interfacial charge extraction.
Figure 4B:
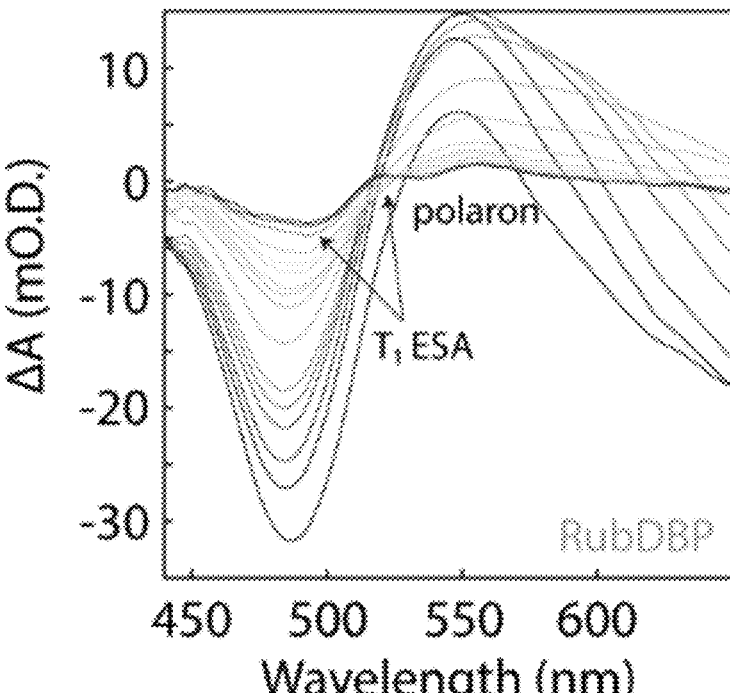
Figure 4C:
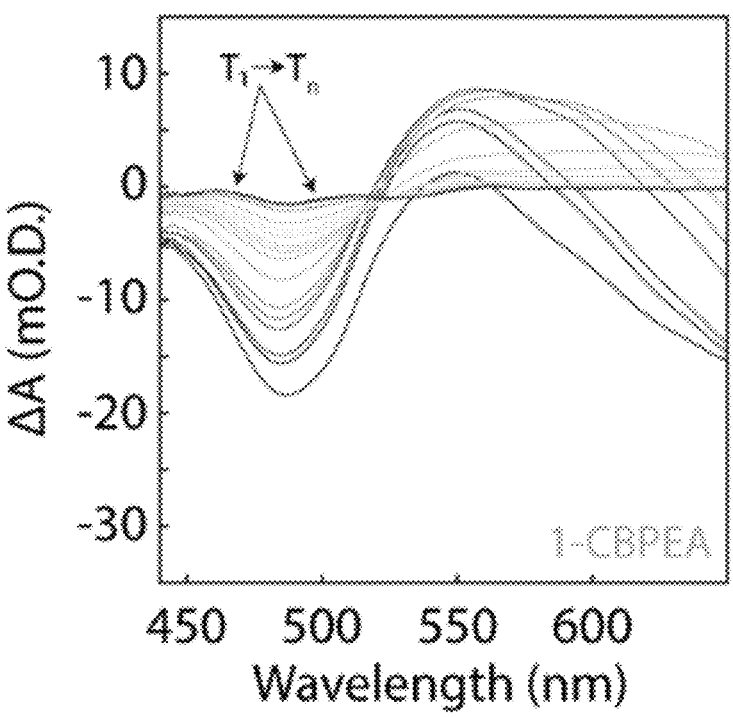

Thus far, it has been shown that charge extraction occurs at the perovskite/OSC interface. However, the observation of charge extraction at the perovskite/OSC interface is not sufficient for triplet generation since single charge transfer would similarly reduce the PL lifetime of the perovskite. To investigate whether the triplet of 1-CBPEA is indeed populated following the hole extraction process at the perovskite/OSC interface, TA spectroscopy is used to probe the ESA corresponding to the $T_1 \rightarrow_n$ transition. FIG. 4A shows the TA spectra for the underlying FAMA sensitizer at selected delay times under 700 nm excitation in the relevant spectral region from 440-650 nm for the triplet-related ESA. The two characteristic bleach features of the perovskite are denoted as PB1 and PB2 respectively, while the perovskite photoinduced absorption feature centered at 550 is labelled as PIA. An additional overlapping bleach and photoinduced absorption attributed to $PbI_2$ is found at 510 and 520 nm, respectively. This excess $PbI_2$ is caused by a post-fabrication acetonitrile treatment of the perovskite surface. It has previously been shown that this solvent treatment increases triplet generation in rubrene due to n-type doping of the perovskite, which increases the hole density at the surface due to interfacial band bending. Once interfaced with the OSCs, additional spectral features corresponding to the $T_1 \rightarrow T_n$ ESA transitions previously shown in FIGS. 1A-1D for both OSCs emerge and can be detected on a subnanosecond timescale for both RubDBP (FIG. 4B) and 1-CBPEA (FIG. 4C). Hence, it is confirmed that the charge extraction observed by PL spectroscopy indeed yields triplet excitons in the OSC layers.

Figure 4D:
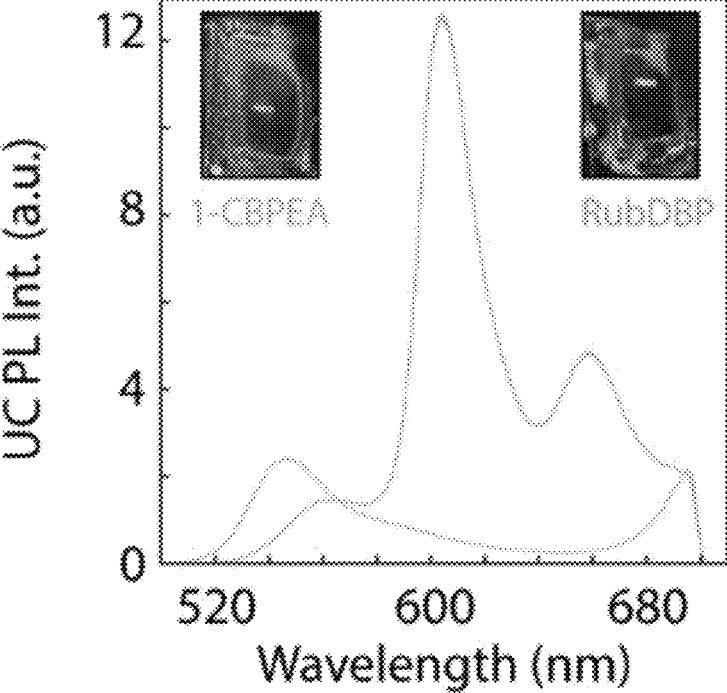

To validate that the triplet generation in the OSC layer results in upconverted emission from the OSC singlet state, the emission of the bilayer devices is probed under 780 nm excitation (FIG. 4D). The RubDBP UC device yields the expected strong emission with a peak emission at 605 nm (FIG. 4D, pink). The 1-CBPEA UC device yields an upconverted emission spectrum peaking at 550 nm, which increases the apparent anti-Stokes shift achievable by perovskite-sensitized UC by 0.2 eV (FIG. 4D, green) relative to the FAMA/RubDBP UC device. The insets show photographs of the corresponding devices under 780 nm excitation where the strong upconverted emission is visible for both UC devices. A stronger intensity of upconverted emission is found for RubDBP than for 1-CBPEA which can be traced back to two factors: (i) a higher triplet generation in rubrene than in 1-CBPEA as indicated by the stronger quenching of the perovskite PL in the case of RubDBP. (ii) A higher native OSC quantum yield: the observed upconverted emission is directly dependent on the underlying OSC PL quantum yield which dictates the fraction of singlet states generated in the TTA-UC process which undergo radiative recombination.

Lastly, the properties of the upconverted PL are investigated. TTA-UC exhibits a characteristic power dependence: at low incident powers, the upconverted PL intensity increases quadratically. In this regime, the triplets decay primarily through other decay pathways. However, above the threshold intensity $I_{th}$ for efficient UC, the upconverted PL intensity increases linearly with incident power. Here, TTA is the predominant triplet decay pathway and the upconversion process becomes efficient. Increasing the excitation power further results in a saturation regime, where the UC process becomes less efficient. To include TTA-UC devices into photovoltaics, an $I_{th}$ significantly lower than the integrated solar spectrum at the wavelength region of interest is required, on the order of $I_{th} < 10$ mWcm$^{-2}$.

Mathematically, the power threshold $I_{th}$ can be expressed by the following equation as described by Monguzzi et al., $$I_{th} = \frac{(k_T)^2}{\gamma_{TT}\alpha(E)\phi_T}.$$

Here, $k_T$ is the annihilator triplet decay rate, $\gamma_{TT}$ is the second order rate constant characterizing the TTA process for a given annihilator, $\alpha(E)$ is the absorption coefficient of the perovskite, and $\phi_T$ represents the efficiency of the generation of the OSC triplet state.

For both annihilators investigated here, the characteristic turnover is found from a slope $\alpha=2\beta$ to $\alpha=\beta$, where $\beta$ is the inherent power dependency of the underlying perovskite PL ($\beta=1.3$). A threshold intensity $I_{th}=18$ mWcm$^{-2}$ is extracted for RubDBP and $I_{th}=195$ mW cm$^{-2}$ for 1-CBPEA. As a note, in this study, the underlying perovskite sensitizer films are kept significantly thinner than the 100 nm optimal thickness that has previously been determined 1 to allow for sufficiently low optical density for TA studies. Upon increasing the perovskite thickness, it has previously been shown that the $I_{th}$ is further reduced due to the increase of $\alpha(E)$. Hence, increasing the sensitizer film thickness will push the $I_{th}$ of the 1-CBPEA UC device towards viable intensity thresholds for device applications.

A back-of-the-envelope calculation allows for further insight into the UC process for the two annihilators and the cause of the discrepancy in the $I_{th}$. The optical density $\alpha(E)$ at 780 nm for both devices is similar and therefore, is not a determining factor. A slightly lower triplet population yield $\phi_T$ is estimated for 1-CBPEA in comparison to RubDBP based on the magnitude of perovskite PL quenching, which in part accounts for a higher threshold intensity $I_{th}$ of 1-CBPEA. However, the effects of the annihilator properties on the efficiency threshold cannot be overlooked and $k_T$ or $\gamma_{TT}$ must be the underlying cause of the differences in the $I_{th}$.

Figure 5A:
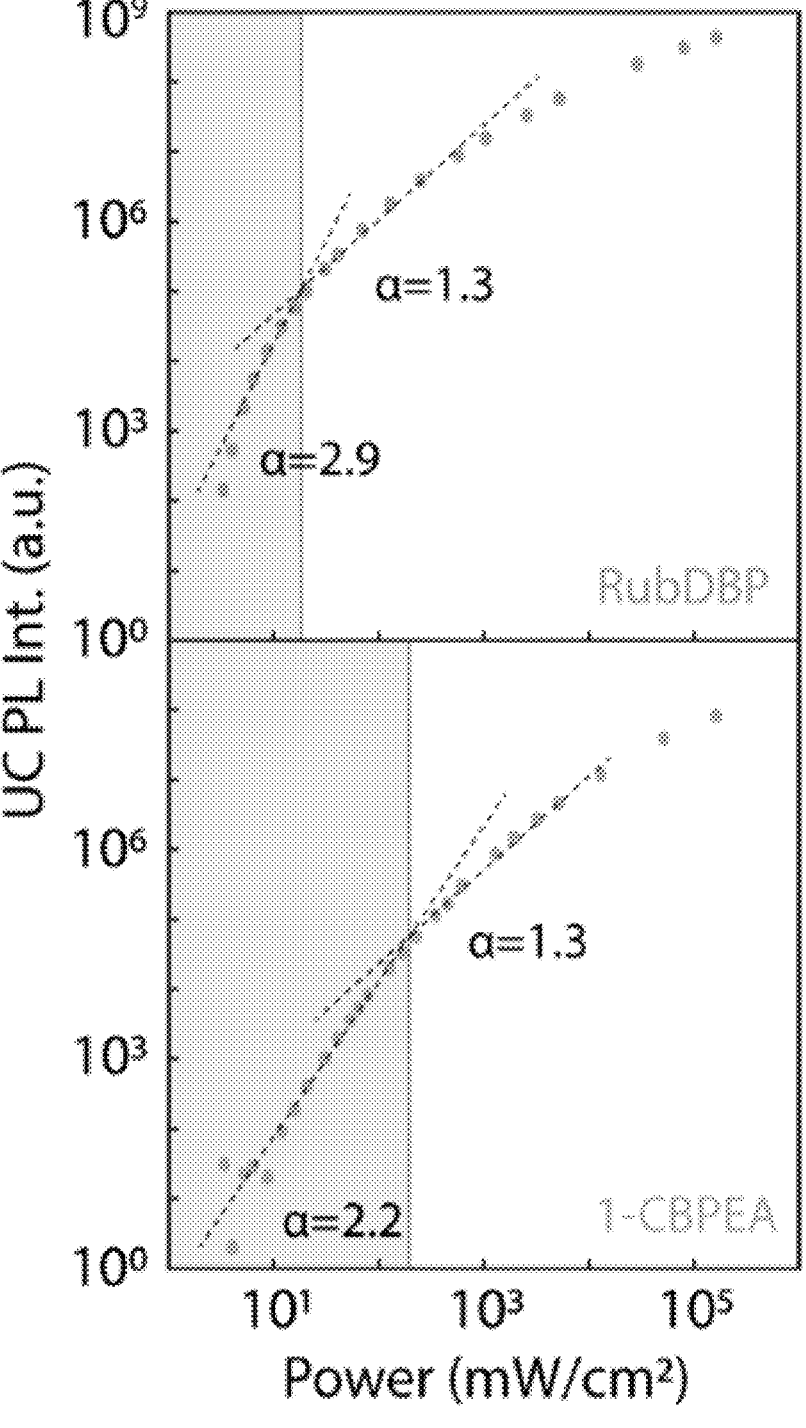
FIG. 5A shows power dependent upconverted emission for the RubDBP (top, pink) and 1-CBPEA (bottom, green) bilayer devices. The intersect of the dashed lines indicating the different TTA-UC regimes yields the $I_{th}$ (vertical grey lines). Calculated intensity threshold $I_{th}$ values for RubDBP and 1-CBPEA films are 18.2 mW/cm² and 195 mW/cm², respectively.
Figure 5B:
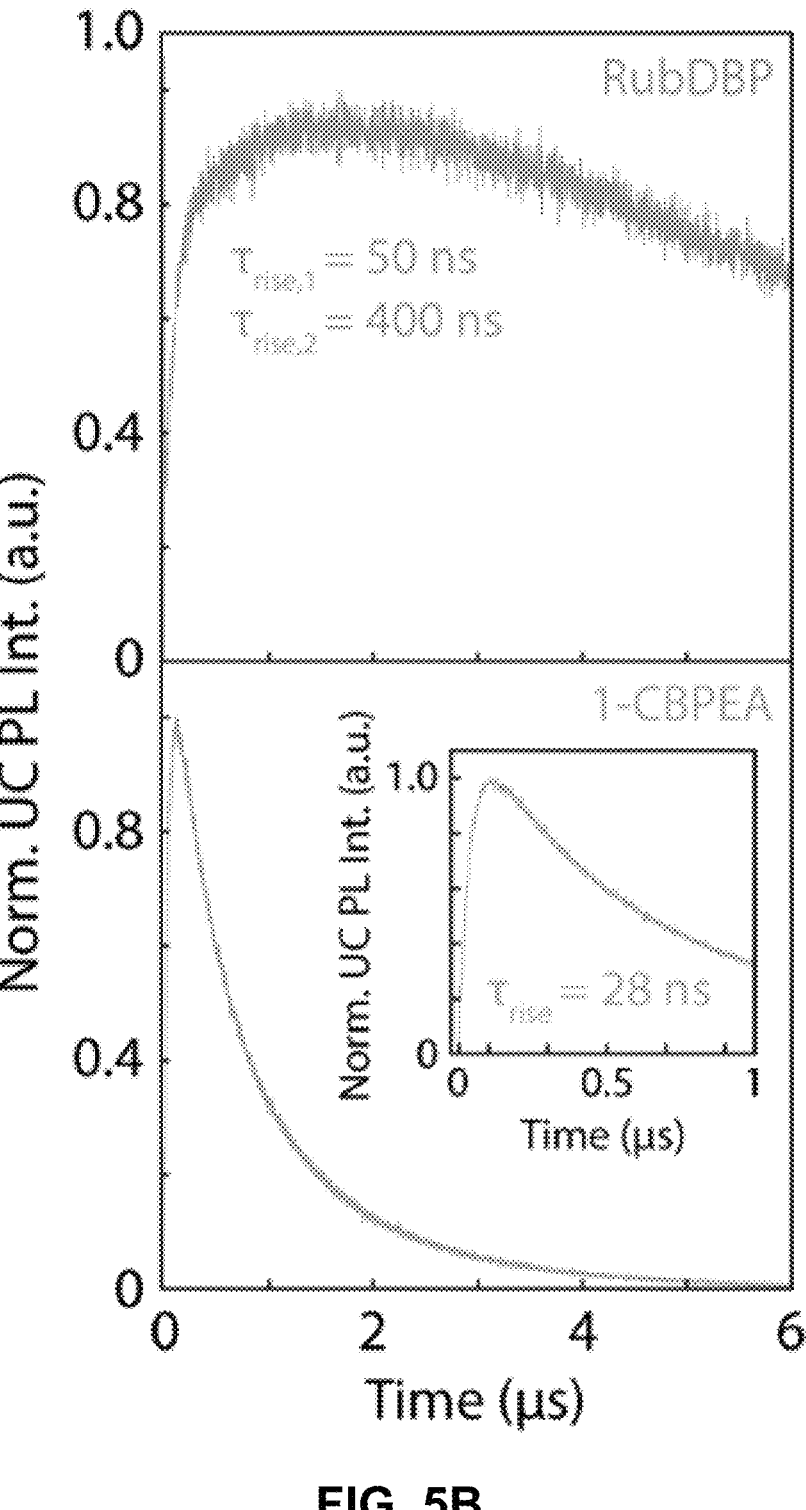
FIG. 5B shows UC PL dynamics for the RubDBP (top) and 1-CBPEA (bottom) films (repetition rate: 50 kHz, power density: 120 mW cm⁻²). A magnification of the early time rise for 1-CBPEA is shown in the inset.

To determine the underlying cause of the difference in the $I_{th}$, the dynamics of the UC PL are investigated (FIG. 5B). The UC PL dynamics are generally governed by two separate processes: (i) the initial rise time which gives the characteristic time of singlet generation. This time scale is a convolution of the triplet generation, TTA-UC and $S_1$ decay. (ii) The long-lived decay, which is rate-limited by the triplet decay. In both cases, a rapid rise of the UC PL is found. RubDBP exhibits two rise times $T_{rise,1}=50$ ns and $T_{rise,2}=400$ ns, due to rapid TTA-UC occurring close to the interface and diffusion-mediated TTA-UC far from the interface.6 1-CBPEA on the other hand shows a single characteristic rise of $T_{rise}=28$ ns, indicating rapid generation of the emissive singlet state. However, the dynamics of the UC PL shown in FIG. 5B also clearly highlight a major difference between the annihilators. Within the 6 μs time window shown, the UC PL of RubDBP has barely started decaying, while the UC PL of 1-CBPEA has already fully decayed. Estimating the triplet lifetime in the solid-state devices based on a tail fit results in a long-lived decay for RubDBP ($T_{RubDBP} > 10$ μs) and a much more rapid decay for 1-CBPEA ($T_{1-CBPEA}=1$ μs). Therefore, based on the UC PL dynamics alone ($k_{T,1-CBPEA}=10^6$ s$^{-1}$, while $k_{T,RubDBP} < 10^5$ $s^{-1}$), it would be expected that the $I_{th}$ of RubDBP to be a minimum of two orders of magnitude lower than that of 1-CBPEA.

To summarize thus far, the trends for $k_T$ and $\phi_T$ predict a significantly larger difference in the $I_{th}$ than observed experimentally. The last key factor in the calculation of the $I_{th}$ is the second order rate constant $\gamma_{TT}$, which is unique to each individual annihilator. According to Monguzzi et al., $\gamma_{TT}$ is dependent on the triplet exciton diffusion length, the probability of TTA generating a singlet state, as well as the exciton interaction distance. To counterbalance the decrease in the $I_{th}$ caused by the significantly longer-lived triplets in RubDBP and higher yield of triplets $\phi_T$, 1-CBPEA must have a much larger $\gamma_{TT}$ to account for the relative differences in the $I_{th}$. Hence, the triplet diffusion rate or probability of TTA-UC occurring in 1-CBPEA must be higher than in the current state-of-the-art solid-state annihilator rubrene. This further solidifies the promise of this new annihilator 1-CBPEA, despite the currently superior performance of RubDBP.

Circling back to the previous discussion of the triplet energy $T_1$ 1-CBPEA, due to the observation of both TTA-UC and SF, it is acknowledged that the previously reported triplet energy of $T_1 \approx 1.2$ eV is indeed accurate in the solid-state devices investigated here. This amounts to half of the singlet energy $S_1$: $E(T_1)=0.5E(S_1)$—the fundamental requirement for both SF and TTA-UC to occur in the same material. However, this result begs the question whether the TTA-UC process here occurs through the true singlet state $S_1$ of 1-CBPEA (~2.6 eV in solution) and which then relaxes to the aggregate-induced red-shifted singlet state at (2.4 eV) or, whether the lower singlet energy of the aggregated state in solid state enables TTA-UC in this material in the first place. As a result, it is emphasized that the translation of solution-phase annihilator properties to the solid state is not straightforward, as the effect of intermolecular coupling cannot be ignored. In fact, it is suggested that the properties of possible annihilators must first be investigated in their aggregated form, prior to making an educated decision on whether they are viable candidates for TTA-UC.

Conclusions

Herein has been demonstrated successful perovskite-sensitized solid-state TTA-UC with a novel annihilator 1-CBPEA in the solid state, enabling near-infrared-to-green UC. While it is acknowledged that the direct comparison between the RubDBP and 1-CBPEA UC devices does highlight that RubDBP at present still outperforms its replacement 1-CBPEA in terms of efficiency and intensity threshold, the 0.2 eV increase in apparent anti-Stokes shift cannot be ignored. Further device improvements by compositional tuning of the perovskite to better match the promise increased triplet quantum yields to boost the UC efficiency.

Additionally, improvements to the OCS film itself may yield increased TTA-UC efficiencies. Wasielewski and co-workers have shown that for the parent molecule BPEA, the fabrication method directly influences the crystal arrangement, and hence the OSC PL quantum yield due to a change in rates of SF. Work by Moth-Poulsen and co-workers highlights the role of the molecular conformation on the singlet and triplet energy surfaces, which dictate the rates of SF and TTA. Together, these results emphasize that a clear fundamental understanding of the molecular conformation at the nanoscale and the effects of the resulting intermolecular interactions are required to further advance this technology. Since 1-CBPEA is also capable of both SF and TTA-UC, the balance between these two processes must be shifted towards TTA. Hence, tailoring the fabrication conditions to favor TTA over SF will be necessary.

In conclusion, herein it has been demonstrated that triplet generation at the perovskite/OSC interface by charge injection is a universal process and is not inherently limited to the perovskite/rubrene interface. Moving forward, focus should be placed on developing new sensitizer/annihilator pairs to expand the library of viable partners.

Example 2: Naphtho[2,3-a]pyrene (NaPy)

Device Synthesis

For the bilayer and OSC thin films, glass substrates were cleaned via sonication for 15 min in each of the following: 2% Hellmanex, deionized water, ethanol, and acetone. After sonication, the substrates were cleaned by UV-ozone (Ossila) treatment for 15 min. Precursor solutions of $PbI_2$ (1.2 M, TCI), CsI (1.2 M, 99.999% Sigma), and FAI (1.2 M, Dyenamo) were prepared in anhydrous DMF:DMSO (9:1 v/v Sigma-Aldrich) in a 1:1.09 ratio. The precursor solution was diluted to 0.6 M prior to spin-coating at 1000 rpm for 10 s then 5000 rpm for 30 s. Anhydrous chlorobenzene (Sigma-Aldrich) was used as the antisolvent. The films were annealed at 120° C. for 45 min prior to solvent treatment (5 s) with acetonitrile (Sigma-Aldrich).16 Naphtho[2,3-a] pyrene (NaPy, 98.0%, TCI) was used without further purification. A 10 mg $mL^{-1}$ solution of NaPy in anhydrous toluene (Sigma-Aldrich) was prepared then spin-coated onto the perovskite substrates at 6000 rpm for 20 s then annealed at 100° C. for 1 min. OSC only films were made by spin-coating NaPy onto bare glass substrates. Films were encapsulated with a glass cover slip using a two-part epoxy (Devcon) under an inert nitrogen atmosphere (<0.5 ppm $O_2$).

Crystal Growth

NaPy crystals were grown in air-free atmosphere (<0.5 ppm $O_2$) through an anti-solvent diffusion method. In a small vial, 70 μL of the 10 mg $mL^{-1}$ NaPy stock was diluted with 470 μL of anhydrous toluene (Sigma) then placed uncapped into a larger vial of an ethanol:toluene (1:1, v/v, Sigma) mixture which was then capped and left undisturbed.

Solution Upconversion

All materials were prepared in an air-free environment (<0.5 ppm of $O_2$). Zinc (II) octaethylporyphrin (ZnOEP) (97%, Sigma) was used without further purification. Stock solution of ZnOEP and NaPy were made by diluting with anhydrous toluene (Sigma). Upconverting solutions contained 7.7 μM ZnOEP and 7.25 μL of the 10 mg $mL^{-1}$ NaPy stock solution diluted to 400 μL with toluene. Solutions were transferred to quartz cuvettes for characterization.

Steady-State Characterizations

Visible absorption spectra were collected with a Thermo Scientific Evolution 220 spectrophotometer. Steady-state PL spectra were collected by an Ocean Optics spectrometer (HR2000+ES) in a homebuilt setup. Direct excitation emission for the thin films and solutions were collected via a 405 nm continuous wave laser (LDH-D-C-405, PicoQuant) at a 30 W $cm^{-2}$ where excess laser scatter was removed via a 425 long-pass filter (Chroma Tech.). The NaPy single crystal direct emission was collected under 405 nm continuous wave at 542 W $cm^{-2}$.

Upconverted emission for the NaPy:ZnOEP solution was collected using a 532 nm pulsed (LDH-P-FA-530L, Pico-Quant) at a repetition frequency of 80 MHz and 15 W $cm^{-2}$. Laser scatter was removed with a 532 nm notch filter (Thorlabs). For the bilayer films, a 780 nm continuous wave laser (LDH-D-C-780, PicoQuant) was used at 152 W $cm^{-2}$ where a 700 nm short-pass filter (Thorlabs) was used to isolate the upconverted signal.

Time-Resolved Emission Spectroscopy (TRES)

Time-resolved PL measurements for the perovskite PL decays were collected under 780 nm picosecond pulsed excitation (LDH-D-C-780, PicoQuant) at 125 kHz with at a power density of 81 mW cm$^{-2}$. An 800 nm long-pass filter (Thorlabs) and 780 nm notch filter (Thorlabs) were used to isolate the perovskite emission and minimize laser scattering. Upconverted PL decays were measured under 780 nm picosecond pulsed excitation (LDH-D-C-780, PicoQuant) at 250 kHz with a power density of 175 mW cm$^{-2}$. A 650 nm short pass (Thorlabs) filter was used to isolate the upconverted emission and remove excess laser scattering. The single photon counting avalanche photodiode used is from Micro Photon Devices, and all collected PL decays was histogrammed by a MultiHarp 150 TCSPC unit from Pico-Quant.

Wavelength dependent maps were collected using a Gemini interferometer (NIREOS) for both the NaPy solution and OSC measurements. TRES maps for the solution measurement were recorded over 180 steps from 425 to 660 nm, and 233 steps with a spectral range of 425 to 700 nm for the NaPy OSC measurement. Both were integrated for 15001 ms. A 405 nm picosecond pulsed laser diode (PicoQuant LDH-D-C-405) was used at a repetition frequency of 1 MHz at a power density of 2.9 mW cm$^{-2}$ for the solution and 98 mW cm$^{-2}$ for the OSC. Photon arrival times were collected via a silicon single-photon avalanche photodiode (Micro Photon Devices SPD-100-COC) connected to a HydraHarp 400 (PicoQuant) event timer. A 425 nm long pass filter (Chroma Tech.) was used to remove excess laser scatter.

Ultrafast Transient Absorption

Transient absorption (TA) measurements were taken using a HELIOS Fire transient absorption spectrometer (Ultrafast Systems). An Astrella-V-F-1K amplifier was used to generate femtosecond laser pulses where the Vitara-S Coherent Ti:Sapphire laser used was amplified using a 1 kHz Coherent Revolution-50 pump laser. The resulting laser pulses were 5 mJ with a full width half max of 100 fs at 800 nm. Pump and probe beams were directed through an optical parametric amplifier (OperaA Solo, Coherent) and delay stage, respectively. The white light continuum was generated via a CaF$_2$ crystal (320 nm to 650 nm). Excess laser scattering was minimized through a dual chopper system, and neutral density filters were used to attenuate pump power. For all measurements, three spectra were collected with a 0.5 s integration time at each delay position with an exponential point collection method starting at 0.01 ps, resulting in a total of 200 points. A 400 nm pump was used at a power density of 1.33 mJ cm$^{-2}$. The TA maps were processed through the Surface Xplorer software package from Ultrafast Systems in addition to MATLAB.

Results and Discussion

Here, naphtho[2,3-a]pyrene (NaPy) is introduced as a possible candidate for further extending the achievable energy gain during UC. NaPy has been previously investigated at the single molecule level using scanning tunneling microscopy, and as a sky-blue dopant dye in organic light emitting devices. To date, NaPy has not been utilized as an annihilator within TTA-UC systems. A previous report by Aggarwal et al. implies that NaPy is a singlet fission (SF) material with an ensemble triplet energy ($T_1$=1.23 eV) at less than half of the singlet energy $S_1$, which forms non-emissive J-aggregates in the solid state.

These results show that NaPy is a successful annihilator in both solution as well as in solid-state UC devices, indicating that its triplet energy $T_1$ must be equal to or higher than half the singlet energy $S_1$. Surprisingly, the results show that the nature of the emissive state is dependent on the pathway through which the singlet state is achieved since the emission exhibits a different branching ratio of the emissive species upon direct emission and UC. However, the relaxation from the emissive singlet excited state should not be sensitive to the pathway that is generated by, except, if different species are predominately emitting under the different conditions, or if the true singlet excited state is not achieved in TTA-UC. This suggests that different OSC states are emitting under direct excitation vs. after successful TTA-UC, which may be due to variations in the local environment of the molecules tuning the energy landscape.8 Grey et al. have shown that conformational flexibility of the phenylethynyl arms in 9,10-bis(phenylethynyl)anthracene (BPEA) results in a change in the energy surface of the singlet and triplet energy manifold voiding the main requirement for TTA-UC: $E(S_1) \lesssim 2$ $E(T_1)$.

Translating this insight to the NaPy study presented here, the underlying inhomogeneity in the OSC film can result in either: i) a change in the charge extraction rate and yield in triplet formation at the perovskite/OSC interface due to a change in the electronic coupling based on the molecular orientation. ii) A change in the rate of TTA due to variations in the intermolecular coupling strength, which has previously also been observed in the reverse process of SF. Or, iii) aggregation-induced lowering of the singlet energy level, resulting in preferential TTA-UC to the aggregate singlet energy level.

Figure 6A:
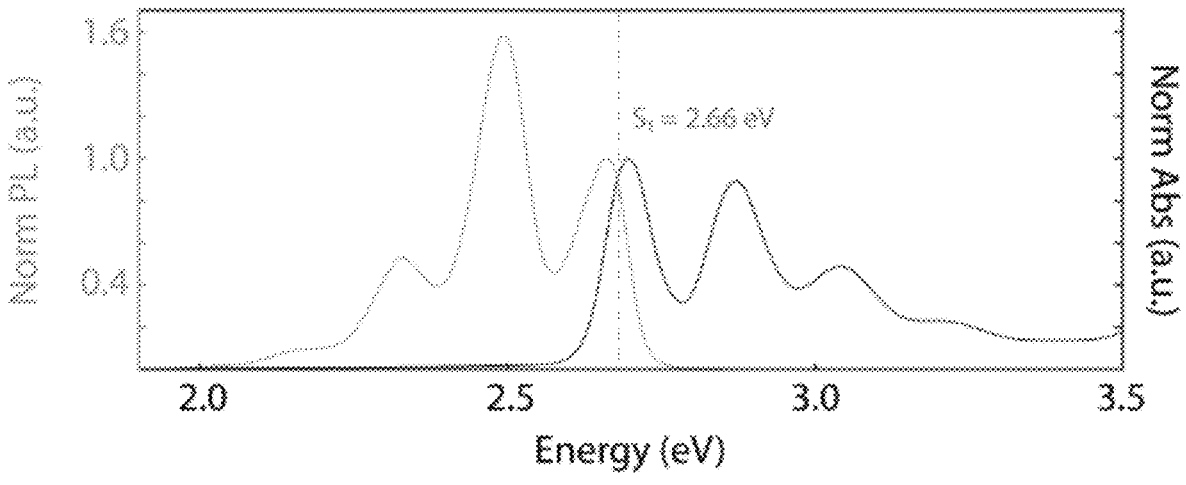
FIG. 6A shows normalized absorbance (black) and PL (blue) spectra of a NaPy in toluene (150 μM) with S1 highlighted.
Figure 6B:
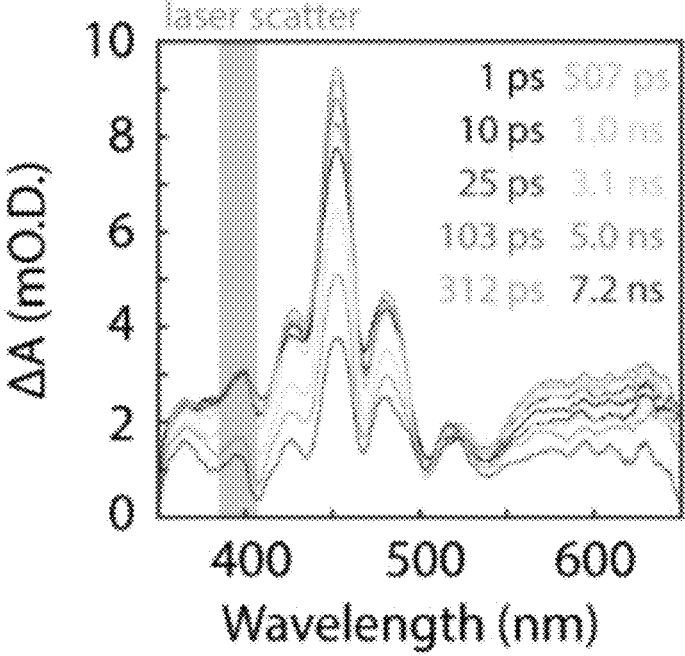
FIG. 6B shows TA spectra extracted at specific delay times for the NaPy solution under 400 nm pump at 1.33 mJ cm⁻². The grey box denotes excess laser scattering.
Figures 6C, 6D:
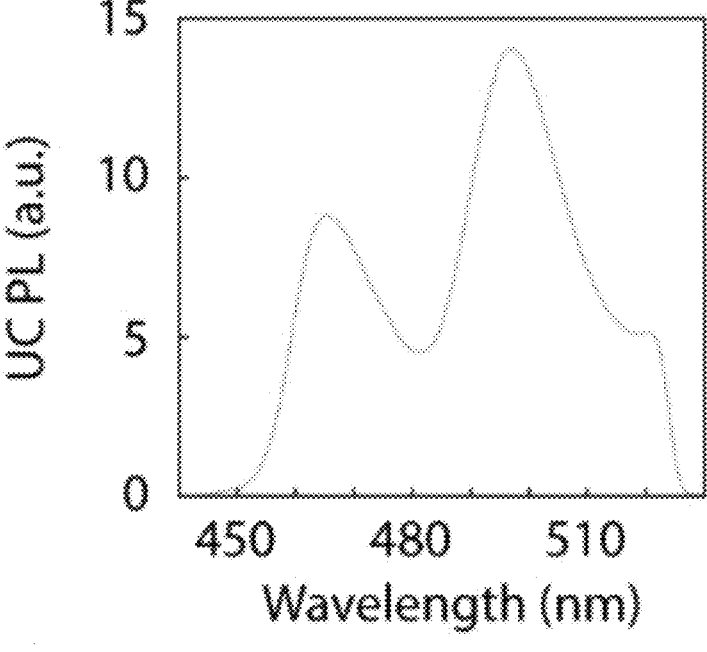
FIG. 6C shows upconverted PL of the NaPy/ZnOEP solution (532 nm, 15 mW cm⁻²).
FIG. 6D shows time-resolved emission (TRES) map of the NaPy solution under 405 nm excitation at a repetition rate of 1 MHz.
Figure 6E:
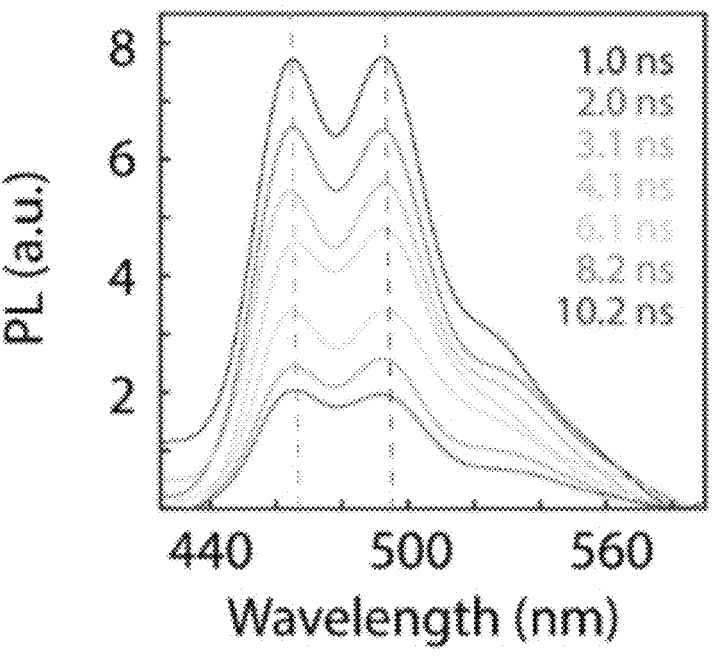
FIG. 6E shows PL spectra extracted at certain delay times; two spectral features 465 (light blue) and 492 nm (dark blue) are highlighted by the dashed lines.
Figure 6F:
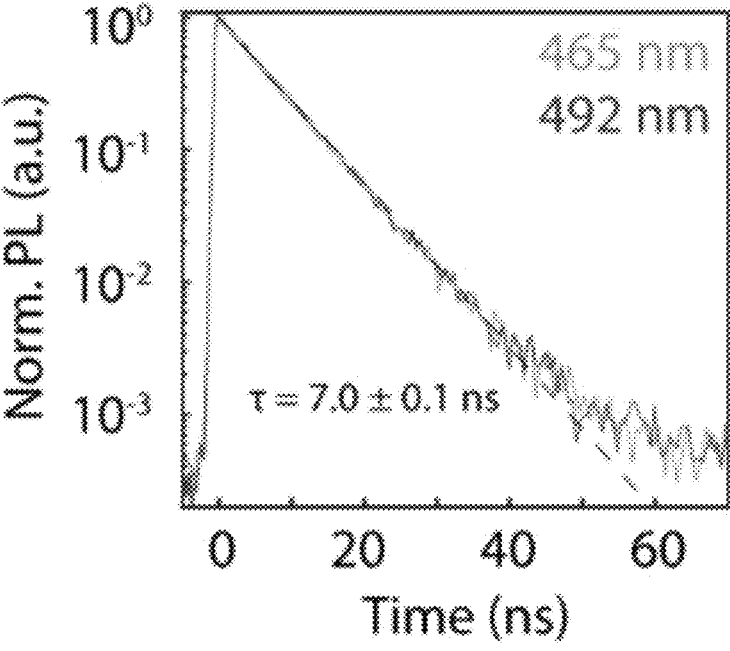
FIG. 6F shows PL decays for the 465 (light blue) and 492 nm (dark blue) features.

To elucidate the photophysical properties of this system, first, the photophysical properties of NaPy are characterized in toluene. FIG. 6A shows the absorbance and photoluminescence (PL) spectra of NaPy at a concentration of 150 μM. The singlet energy level of the NaPy monomer is extracted at $S_1$=2.66 eV. Reminiscent of the transient absorption spectroscopy (TA) of rubrene, TA of the NaPy solution yields a strong singlet-related excited state absorption (ESA) $S_1 \rightarrow S_n$ which overlaps and dominates the expected spectral region of the ground state bleach (FIG. 6B). However, as indicated previously, here, NaPy is investigated as a triplet annihilator. To further pinpoint the triplet energy level in this molecule, zinc octaethylporphyrin (ZnOEP, $T_1$=1.78 eV) is utilized to sensitize the triplet state of NaPy in solution. As shown in FIG. 6C, upconverted PL is successfully observed under 532 nm excitation. However, the successful observation of TTA-UC provides a lower bound of ~1.3 eV for the NaPy triplet energy $T_1$ in solution due to the fundamental energetic requirement of TTA-UC: $E(S_1) \lesssim 2$ $E(T_1)$, while the upper bound of the triplet energy is set by the ZnOEP triplet energy of 1.78 eV. This is in good agreement with the previous report of the triplet energy of the NaPy monomer: T1<1.37 eV.

Figure 7A:
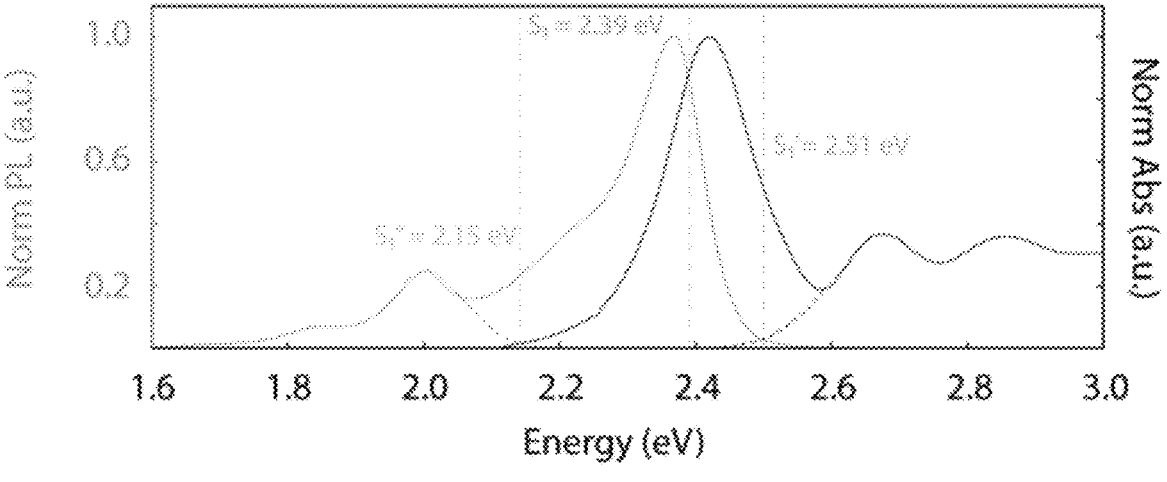
FIG. 7A shows solid-state absorption (black) and PL (blue) of the NaPy OSC film with the different possible S1 states highlighted. The dashed lines are Gaussian fits to the absorption and PL for extrapolation of S1' and S1".

Having demonstrated successful UC in solution, solid-state NaPy OSC thin films as well as lead halide perovskite bilayer thin films consisting of the methylammonium-free 9% cesium 91% formamidinium lead triiodide perovskite ($Cs_{0.09}FA_{0.91}PbI_3$, CsFA) to increase long-term device stability are fabricated. The absorbance spectrum of solid-state NaPy OSC film in FIG. 7A shows the expected slightly red-shifted vibronic transitions with respect to the solution spectra, as well as an additional pronounced, red-shifted aggregation-induced absorbance feature with higher oscillator strength, which is in agreement with the previously reported J-type aggregation of this material. The corresponding solid-state PL spectrum of NaPy under 405 nm excitation surprisingly is made up of two distinct, independent transitions: 1) the expected emission (~520 nm, 2.38 eV) from an amorphous NaPy thin film, with slightly redshifted features due to changes in the effective dielectric environment and the first vibronic transition (0-0) diminished in contrast to solution due to intermolecular interactions and reabsorption effects.) A weaker redshifted aggregate-induced emission feature (~620 nm, 2.0 eV) that was not previously present in solution (compare FIG. 6A) and has not previously been reported. Extraction of the singlet energy based on the spectral overlap between the absorption and emission analogous to the previous solution measurement yields $S_1$=2.39 eV. However, if the two observed emissive states are viewed as discrete independent states, a singlet energy $S_1'$=2.51 eV is extracted for the molecular emission, while the singlet energy for the aggregate state is $S_1''$=2.15 eV.

Figure 7B:
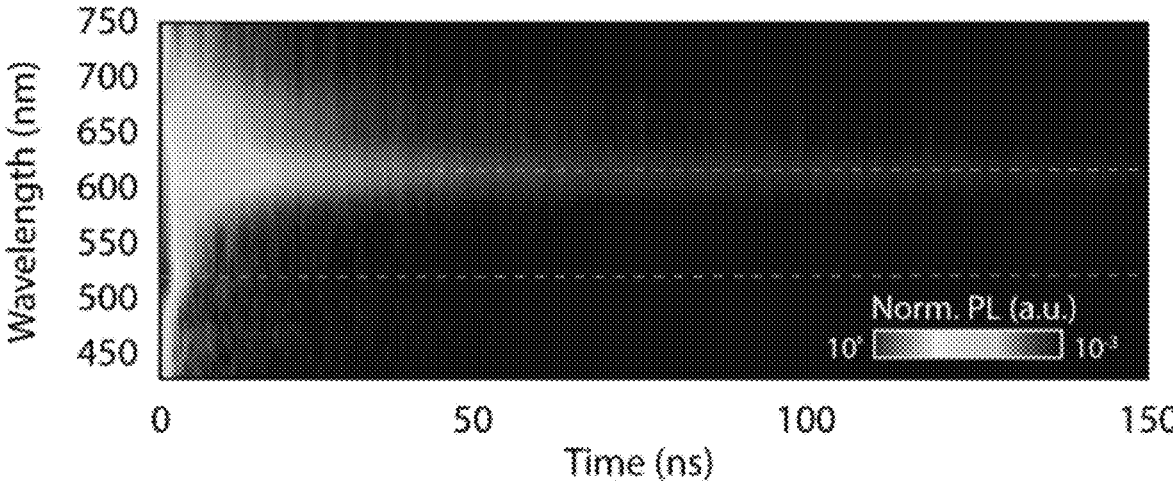
FIG. 7B shows a TRES map of the NaPy OSC under 405 nm excitation at a repetition rate of 1 MHz.
Figure 7C:
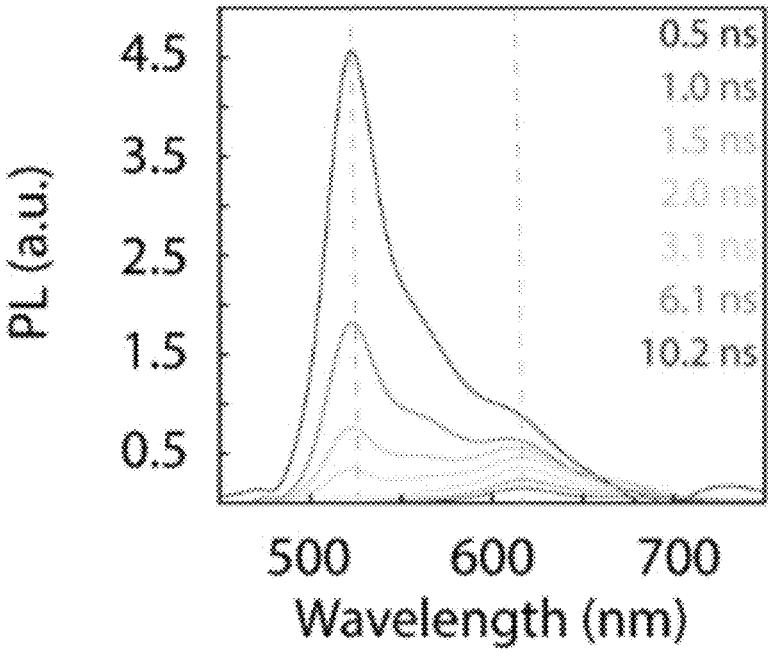
FIG. 7C shows spectra extracted from the TRES map, where spectral features at 521 nm (green) and 620 nm (orange) are highlighted by the dashed lines.
Figure 7D:
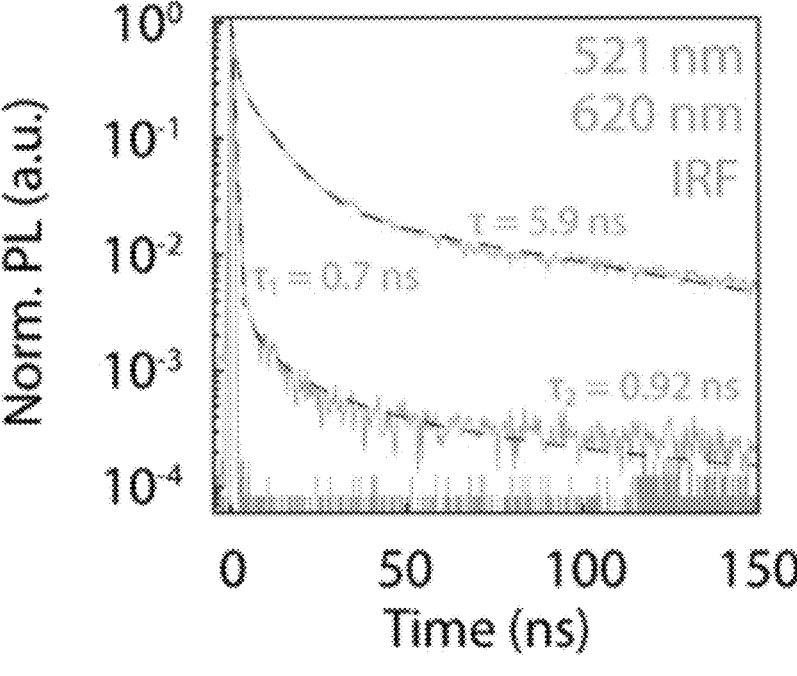
FIG. 7D shows PL decays for the 521 nm (green) and 620 nm (orange) spectral features with the associated PL lifetime. The instrument response function (IRF) is shown in gray.

To highlight the fact that these states are indeed discrete and unrelated, time-resolved emission spectroscopy (TRES) is used. FIGS. 7B-7D emphasize the differences in the PL lifetime of these two features. The PL spectra at selected decay times show that within the instrument response function of this setup (~0.3 ns) both states are populated. However, at early times, the emission from the amorphous molecular environment dominates, while the delayed fluorescence (t>3 ns) is dominated by the aggregation-induced emission (FIG. 7C). The bright PL at 520 nm decays with an early lifetime of $\tau$=0.66 ns with power law dependence (t-0.92) at later times which has shown to be characteristic of geminate fusion of the associated triplet pair state 1(TT) and the separated pair state (T . . . T), while the redshifted aggregate-induced emission at 620 nm is long-lived and decays triexponentially with $\tau_{ave}$=5.9 ns (FIG. 7D). Interestingly, the considerable Stokes shift (0.42 eV) of this aggregate-induced emission and long emission lifetime, shown in FIG. 7D are in contrast to the expected properties of a J-aggregate,36 and are closer in property to e.g., an excimer state. This may indicate that the aggregate state is not directly emitting, rather emission occurs after internal conversion to another state, such as the 'dull' state proposed by Schmidt and coworkers for tetracene thin films. As a result, this aggregate state is not directly referred to as a J-aggregate.

Figure 8:
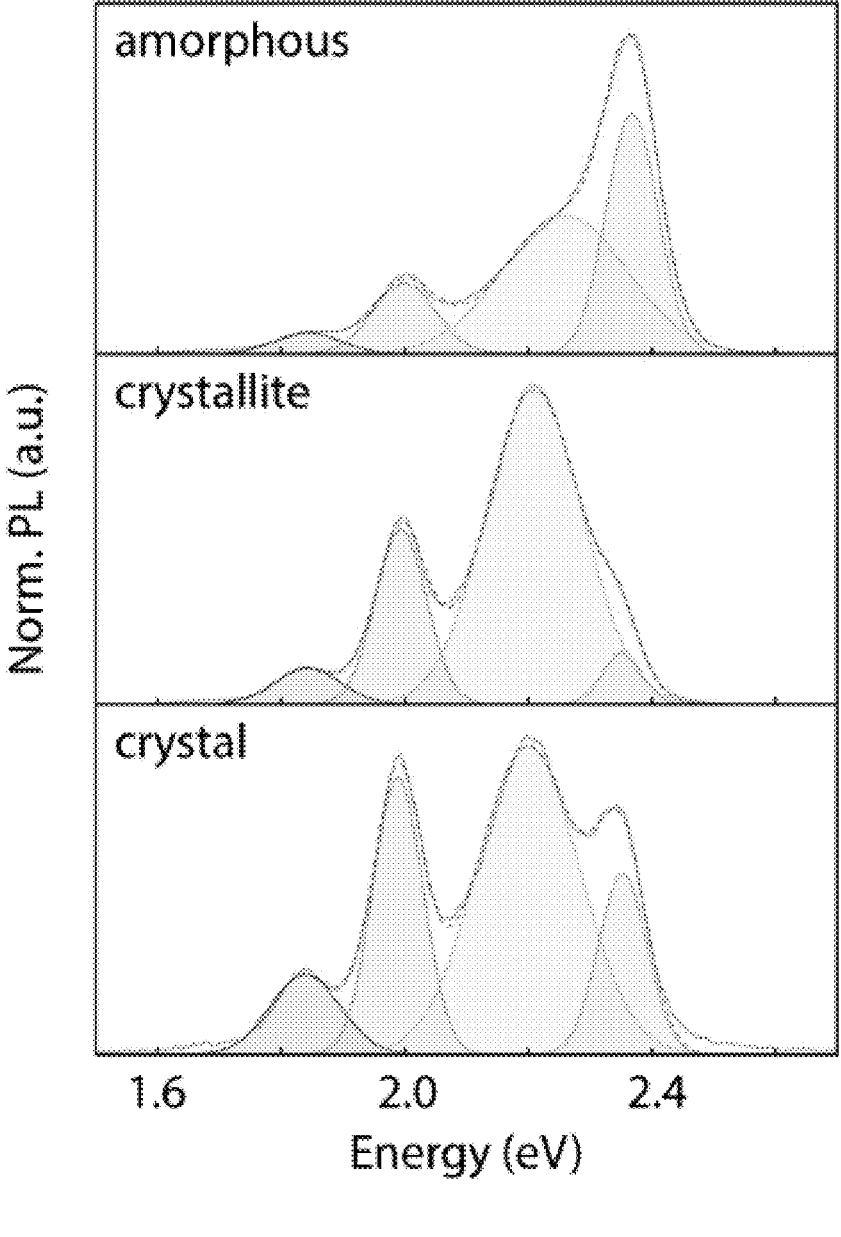
FIG. 8 shows Gaussian fits to the PL for the amorphous (top) and crystallite (middle) NaPy thin films and macroscopic NaPy crystal (bottom). The dashed line represents the sum of the individual Gaussian fits, with the light blue trace as the experimentally observed PL spectra for each.

To unravel the cause of the different emissive states in NaPy in more detail, the local environment of the NaPy molecules is changed by fabricating samples with different degrees of crystallinity to investigate its role on the emissive properties in more detail. For the smooth OSC thin films presented thus far, the emission from the molecular state at 521 nm dominates the emission spectrum (FIG. 8, top). This is in agreement with a largely amorphous film, where intermolecular interactions are weak, and little long-range order is present. When an OSC film with larger crystallites is formed from a supersaturated NaPy solution, two distinct emission spectra are found. In the amorphous regions between crystallites, the PL spectrum corresponding to amorphous NaPy is found, while on the crystallites, the red-shifted aggregate emission is increased in intensity (FIG. 8, middle). Lastly, a macroscopic NaPy crystal is grown, which exhibits strong emission from the red-shifted aggregate feature (FIG. 8, bottom). However, when considering the lower quantum yield of the aggregate state, it becomes apparent that the aggregate state dominates the optical properties of the ordered crystal. All emission spectra can be fit to four Gaussians, indicating that the same optical transitions are present for each crystalline environment.

Figure 9A:
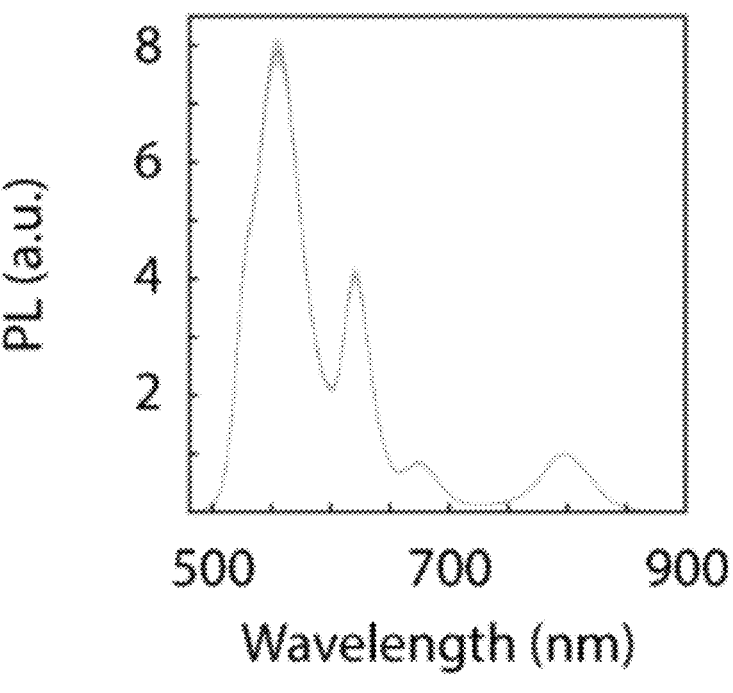
FIG. 9A shows average PL of the CsFA/NaPy bilayer film under 405 nm (30 W cm⁻²) excitation across four different spots. The shaded region represents the 95% confidence interval, indicating a homogeneous emission spectrum across the sample.
Figure 9B:
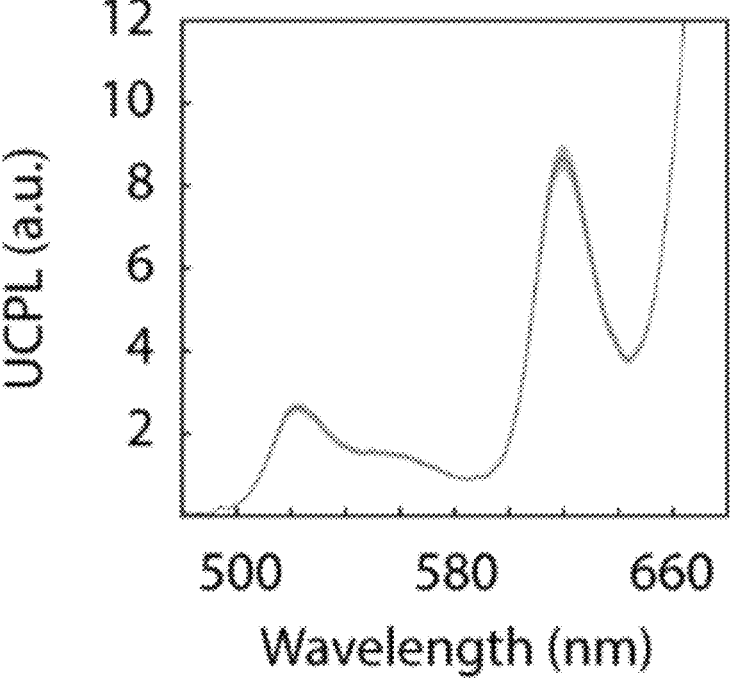
FIG. 9B shows average UCPL of the CsFA/NaPy bilayer under 780 nm (153 W cm⁻²) excitation across ten spots. The shaded region represents the 95% confidence interval.
Figure 9C:
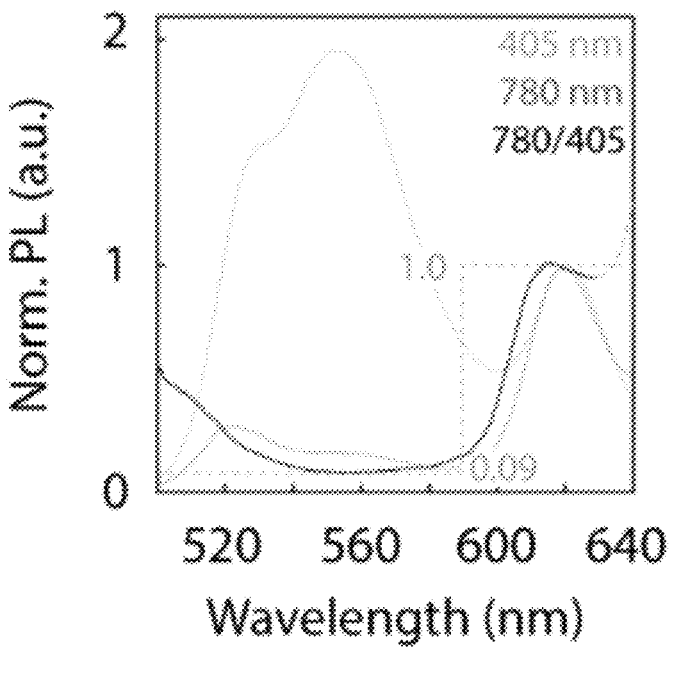
FIG. 9C shows a ratio of NaPy spectral features (black) under 405 nm (blue) and 780 nm (red) excitations normalized to the 620 nm aggregate PL feature.

Lastly, the properties of NaPy as a solid-state annihilator when interfaced with the perovskite triplet sensitizer are investigated. FIG. 9A shows the emission of the CsFA/NaPy bilayer device under 405 nm excitation. As expected, the NaPy emission features for both the molecular and aggregate emission are found, as well as the residual perovskite emission. However, under 780 nm excitation, where only the perovskite is excited and emission from NaPy stems from the TTA-UC process, the emission spectrum is considerably different (FIG. 9B). The high-energy PL is reduced in intensity while the low-energy PL at 620 nm is strongly enhanced. In addition, the first vibronic feature of the upconverted PL is enhanced in comparison to the direct PL. However, as emphasized previously, the emission spectrum and branching ratio between multiple emissive states should not be sensitive to the process by which the singlet state is accessed, unless the true singlet state is not actually reached in the UC process. To further show the changes present between direct excitation and upconversion, the upconverted emission spectrum is normalized by the emission under direct excitation (FIG. 9C). The upconversion efficiency $\eta$!" is proportional to the triplet generation efficiency ($\eta_{ET}$), the efficiency of TTA ($\eta_{TTA}$), as well as the quantum yield of NaPy ($\eta_{QY}$):

$$\eta_{vc} \propto \eta_{ET}\eta_{TTA}\eta_{QY}$$

By removing the impact of the direct emission intensity ($\propto \eta_{QY}$), i.e., accounting for the much higher emission yield from the high energy state $S_1'$, this normalization emphasizes the ratio of the upconverted photons stemming from each distinct state. The dominant emissive state is clearly the low energy aggregate-based state, with a ratio of 1:0.09 (aggregate:direct emission). However, it is not yet clear whether this effect is caused by the charge extraction step at the perovskite/NaPy interface, or if the triplet diffusion and annihilation rates are improved in the aggregate due to increased electronic coupling, or whether the lowering of the singlet energy in the aggregate results in preferential TTA-UC to the aggregate singlet energy level ($S_1''$=2.15 eV) due to the increased energetic driving force since $E(S_1'')<2$ $E(T_1)$.

Figure 9D:
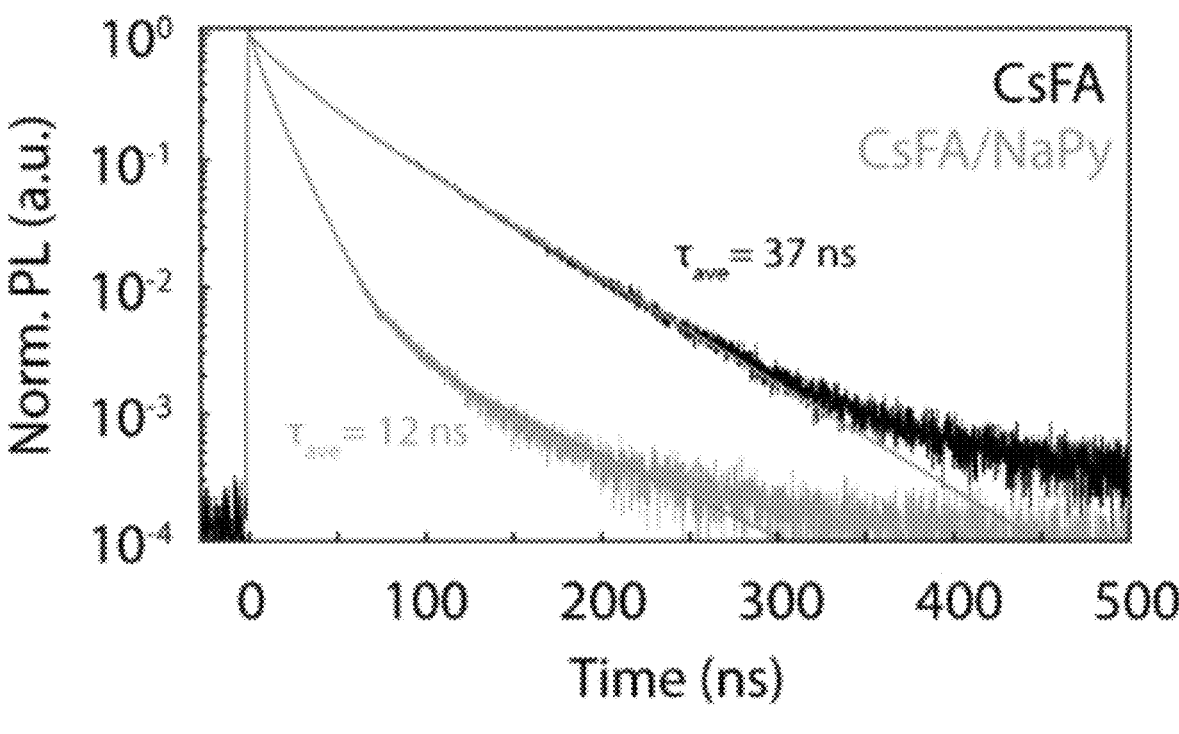
FIG. 9D shows perovskite PL decays for the CsFA and CsFA/NaPy films under 780 nm excitation (81 mW cm⁻²). Triexponential fits (grey) and amplitude weighted lifetimes are included for both films.

The PL decays of the CsFA perovskite and bilayer films shown in FIG. 9D follow the same trend as previously established for both the established rubrene system and novel 1-CBPEA system, where charge extraction at the perovskite/OSC interface results in quenching of the perovskite lifetime. Investigations into the upconverted dynamics, however, show clear similarities to the 1-CBPEA system and stark differences to the rubrene UC system: a single rapid rise of trise=10 ns is found and within the time window of 4 μs, the UCPL has nearly decayed entirely. Comparison of the CsFA/NaPy bilayer perovskite lifetime of $t_{ave}$=12 ns rules out its contribution to the longer-lived decay observed in the UCPL on the order of 3 μs. However, this is only a lower bound for the triplet lifetime, as previous studies have shown that the repetition rate can influence the extracted triplet lifetime.

Lastly, the results are put into context with the previously suggested causes for the differences in the PL spectra under direct excitation or after upconversion. Since no distinct changes in the perovskite PL lifetimes are found across a sample, and the same spot shows a different PL spectrum under 405 and 780 nm excitation, differences in charge extraction are ruled out as the underlying cause. While increased coupling and triplet diffusion within the aggregate may indeed play an underlying role, if the singlet energy achieved after TTA-UC is equal to the same $S_1$ state that is directly excited, the same branching ratio between the emissive states as under direct excitation would still be expected.

Figure 9E:
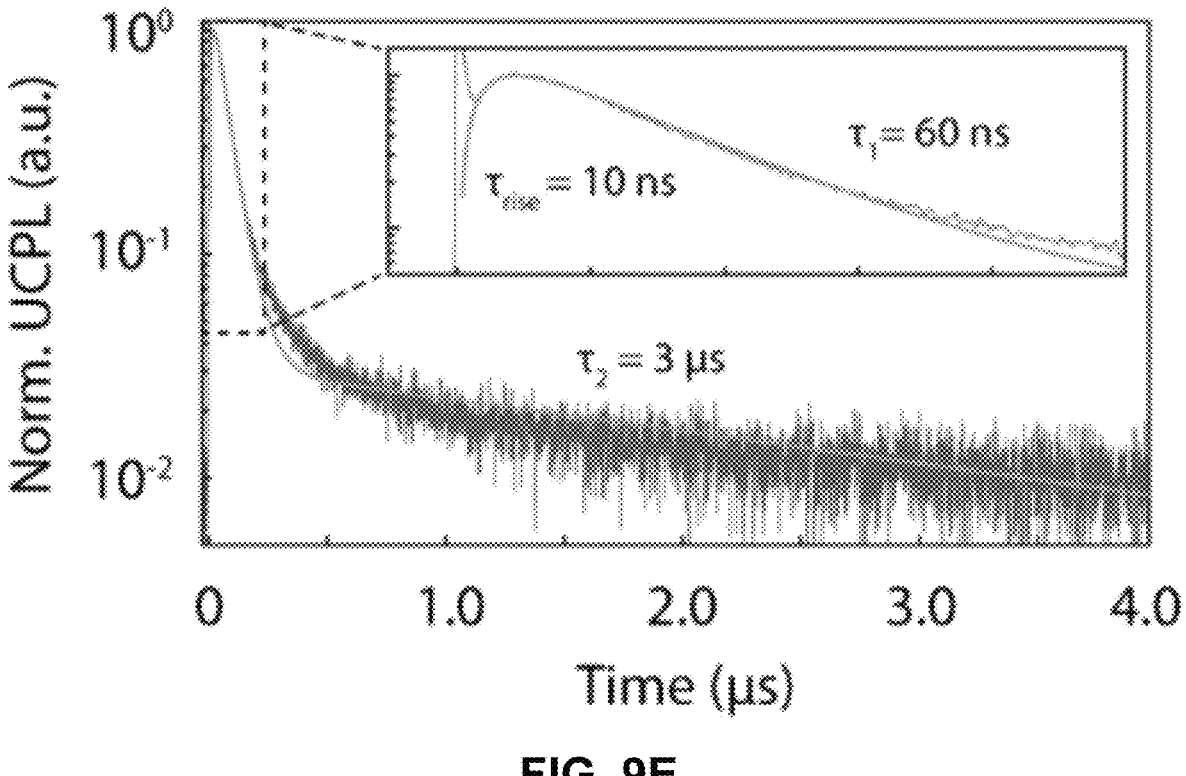
FIG. 9E shows UCPL dynamics of the CsFA/NaPy bilayer under 780 nm excitation measured at 250 kHz (175 mW cm⁻²). The corresponding fit (grey) and lifetimes of the singe rising exponential, and two decaying exponentials are included. The inset highlights the early rise and decay. The immediate spike in intensity is due to a small amount of overlapping perovskite PL.
Figure 9F:
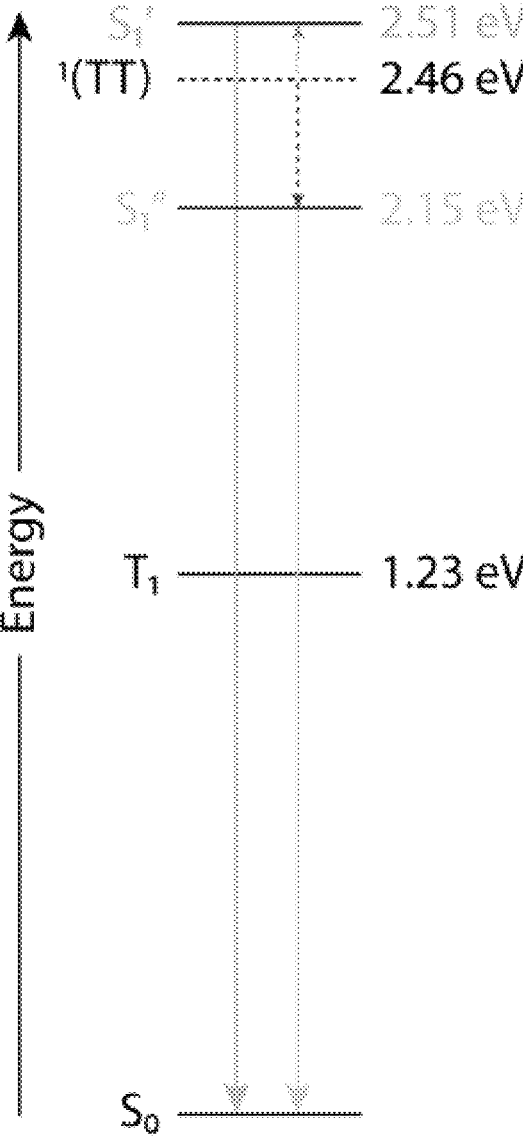
FIG. 9F shows a proposed energy diagram for the different states present within NaPy.

Hence, it is proposed that the aggregation-induced lowering of the singlet excited state changes the fundamental energy landscape such that the triplet pair state 1(TT) formed during TTA-UC is straddled by the higher energy molecular singlet energy level S1' and the lower aggregate singlet energy $S_1''$ (FIG. 9E). As a result, conversion of 1(TT) to $S_1''$=2.15 eV will occur rapidly and with high efficiency since the process is exothermic, while the conversion of 1(TT) to $S_1'$=2.51 eV is slightly endothermic. Considering Aggarwal's triplet energy assignment for NaPy in solid state: $T_1$=1.23 eV, this places 1(TT) at 2.46 eV, 50 meV below $S_1'$, an energy barrier that can be slowly overcome with ambient thermal energy, but with lower efficiency than the exothermic depopulation pathway to $S_1''$.

In conclusion, the results presented here highlight the critical role of the underlying crystal structure and resultant intermolecular electronic coupling on the energy landscape underlying TTA-UC and the reverse process of singlet fission. Furthermore, this study indicates that aggregation-induced effects can not only be used as leverage to influence the efficiency and rate of TTA-UC, but also be used as a feature to turn on TTA-UC in singlet fission materials by simply modifying the energy landscape. This result has the potential to reshape the experimental approach to finding new, compatible annihilators for solid-state UC. The key to unlocking TTA-UC will be to fundamentally understand the photophysical properties of not only the OSC monomers, but their ensemble properties stemming from intermolecular interactions on the nanoscale to the macroscale and on timescales ranging from femtoseconds to milliseconds. Albeit beyond the scope of this initial study, future studies that spatially and spectrally resolve and pinpoint the nature of the underlying emissive states in NaPy will be of interest.

It should be emphasized that the above-described embodiments of the present disclosure are merely possible examples of implementations set forth for a clear understanding of the principles of the disclosure. Many variations and modifications may be made to the above-described embodiment(s) without departing substantially from the spirit and principles of the disclosure. All such modifications and variations are intended to be included herein within the scope of this disclosure and protected by the following claims.

REFERENCES

1. Aggarwal, N.; et al. J. Chem. Sci. 2019, 131 (6), 52. doi: 10.1007/s12039-019-1626-5.
2. Akbulatov, A. F.; et al. Nano Energy 2021, 86, 106082. doi: 10.1016/j.nanoen.2021.106082.Alves, J. et al, J. Mater. Chem. C, 2022, 10, 7783-7798.
3. Bae, Y. J. et al, J. Am. Chem. Soc., 2018, 140, 15140-15144.
4. Bae, Y. J. et al, J. Chem. Phys., 2019, 151, 044501.
5. Bieber, A. S. et al, J. Chem. Phys., 2020, 153, 084703.
6. Bieber, A. S. et al, J. Chem. Phys., 2021, 155, 234706.
7. Boldyreva, A. G.; et al. ACS Appl. Mater. Interfaces 2020, 12 (16), 19161-19173. doi: 10.1021/acsami.0c01027.
8. Bossanyi, D. G.; et al. J. Mater. Chem. C 2021. doi: 10.1039/D1TC02955J.
9. Bossanyi, D. G. et al, J. Mater. Chem. C, 2022, 10, 4684-4696.
10. Bricks, J. L.; et al. Methods Appl. Fluoresc. 2017, 6 (1), 012001. doi: 10.1088/2050-6120/aa8d0d.
11. Conti, C. R. et al, ACS Energy Lett., 2022, 7, 617-623.
12. Deshmukh, A. P.; et al. Chem. Phys. Rev. 2022, 3 (2), 021401. doi: 10.1063/5.0094451.
13. Deshmukh, A. P.; et al. J. Phys. Chem. C 2019, 123 (30), 18702-18710. doi: 10.1021/acs.jpcc.9b05060.
14. France, C. B.; et al. Langmuir 2004, 20 (7), 2713-2719. doi: 10.1021/la035532i.
15. France, C. B.; et al. J. Am. Chem. Soc. 2003, 125 (42), 12712-12713. doi: 10.1021/ja0370560.
16. Geva, N. et al, J. Phys. Chem. Lett., 2019, 10, 3147-3152.
17. Gray, V. et al, Phys. Chem. Chem. Phys., 2017, 19, 10931-10939.
18. Gray, V.; et al. Phys. Chem. Chem. Phys. 2017, 19 (17), 10931-10939. doi: 10.1039/C7CP01368J.
19. Guo, S. et al, Chem. Sci., 2015, 6, 3724-3737.
20. Guo, S. et al, Dyes and Pigments, 2013, 96, 449-458.
21. Häring, M. et al, Chem. Commun., 2015, 51, 16848-16851.
22. Hestand, N. J.; et al. Chem. Rev. 2018, 118 (15), 7069-7163. doi: 10.1021/acs.chemrev.7b00581.
23. Huang, Z. et al, J. Phys. Chem. Lett., 2018, 9, 6198-6206.
24. Imperiale, C. J. et al, Chemical Science, 2021, 12, 14111-14120.
25. Iski, E. V.; et al. J. Vac. Sci. Technol. A 2011, 29 (4), 040601. doi: 10.1116/1.3602072.
26. Jarikov, V. V. J. Appl. Phys. 2006, 100 (1), 014901. doi: 10.1063/1.2214535.
27. Ji, G. et al, Phys. Chem. Chem. Phys., 2017, 19, 6546-6553.
28. Kim, J.-H. et al, ACS Photonics, 2014, 1, 382-388.
29. Kulbak, M.; et al. J. Phys. Chem. Lett. 2015, 6 (13), 2452-2456. doi: 10.1021/acs.jpclett.5b00968.
30. Kwon, J.; et al. Org. Electron. 2010, 11 (6), 1103-1110. doi: 10.1016/j.orgel.2010.03.017.
31. Lai, H.; et al. Org. Polym. Lumin. Mater. 2019, 30 (11), 1979-1983. doi: 10.1016/j.cclet.2019.09.009.
32. Lee, J.-W.; et al. Adv. Energy Mater. 2015, 5 (20), 1501310. doi: 10.1002/aenm.201501310.
33. Levine, A. M.; et al. J. Phys. Chem. C 2021, 125 (22), 12207-12213. doi: 10.1021/acs.jpcc.1c02737.
34. Lim, S.-H.; et al. Phys. Rev. Lett. 2004, 92 (10), 107402. doi: 10.1103/PhysRevLett.92.107402.
35. Lyu, Y.-Y. et al, Advanced Materials, 2008, 20, 2720-2729.
36. Ma, L. et al, Phys. Chem. Chem. Phys., 2012, 14, 8307-8312.
37. Mahboub, M. et al, Nano Letters, 2016, 16, 7169-7175.
38. Manna, B. et al, J. Phys. Chem. C, 2018, 122, 21047-21055.
39. Merkel, P. B. et al, Journal of Luminescence, 2009, 129, 303-306.
40. Miyashita, T. et al, J. Phys. Chem. Lett., 2022, 13, 3002-3007.
41. Mongin, C. et al, Science, 2016, 351, 369-372.
42. Monguzzi, A. et al, Phys. Chem. Chem. Phys., 2012, 14, 4322-4332.
43. Monguzzi, A. et al, The Journal of Physical Chemistry A, 2009, 113, 1171-1174.
44. Monguzzi, A. et al, Phys. Rev. B, 2008, 78, 195112.
45. Mukazhanova, A.; et al. J. Phys. Chem. A 2020, 124 (16), 3055-3063. doi: 10.1021/acs.jpca.9b08117.
46. Nandi, A. et al, Phys. Chem. Chem. Phys., 2019, 21, 11193-11202.
47. Nienhaus, L. et al, ACS Energy Lett., 2019, 888-895.
48. Nienhaus, L. et al, ACS Nano, 2017, 11, 7848-7857.

25
26

49. Prashanthan, K. et al, J. Chem. Phys., 2020, 153, 164711.
50. Rigsby, E. M. et al, J. Chem. Phys., 2020, 153, 114702.
51. Ronchi, A, et al, Phys. Chem. Chem. Phys., 2019, 21, 12353-59.
52. Saliba, M.; et al. Energy Environ. Sci. 2016, 9 (6), 1989-1997. doi: 10.1039/C5EE03874J.
53. Seki, K.; et al. J. Phys. Chem. C 2018, 122 (22), 11659-11670. doi: 10.1021/acs.jpcc.8b02234.
54. Singh-Rachford, T. N. et al, Inorg. Chem., 2009, 48, 2541-2548.
55. Spano, F. C.; et al. Annu. Rev. Phys. Chem. 2014, 65 (1), 477-500. doi: 10.1146/annurev-physchem-040513-103639.
56. Stranks, S. D. et al, Science, 2013, 342, 341-344.
57. Sullivan, C. M.; et al. Nanoscale 2023, 15 (3), 998-1013. doi: 10.1039/D2NR05767K.
58. Sullivan, C. M.; et al. Nanoscale 2022, 14 (46), 17254-17261. doi: 10.1039/D2NR05309H.
59. Sullivan, C. M.; et al. Adv. Opt. Mater. 2023, 11 (1), 2201921. doi: 10.1002/adom.202201921.
60. Tayebjee, M. J. Y.; et al. Phys. Chem. Chem. Phys. 2013, 15 (35), 14797-14805. doi: 10.1039/C3CP52609G.
61. Tress, W. et al, Advanced Energy Materials, 2015, 5, 1400812.
62. Valle-Pulido, J.; et al. Sol. Energy 2023, 258, 148-155. doi: 10.1016/j.solener.2023.04.058.
63. VanOrman, Z. A. et al, ACS Energy Lett., 2021, 6, 3686-3694.
64. VanOrman, Z. A. et al, Appl. Phys. Lett., 2021, 118, 203903.
65. VanOrman, Z. A. et al, Chem. Mater., 2020, 32, 4734-4742.
66. Vorona, M. Y. et al, Materials, 2020, 13, 1961.
67. Wang, K. et al, RSC Adv., 2021, 11, 17755-17759.
68. Wang, L. et al, Advanced Materials, 2021, 33, 2100854.
69. Wieghold, S. et al, Advanced Optical Materials, 2021, 9, 2001470.
70. Wieghold, S. et al, ChemPhotoChem, 2020, 4, 704-712.
71. Wieghold, S.; et al. J. Phys. Chem. C 2020, 124 (33), 18132-18140. doi: 10.1021/acs.jpcc.0c05290.
72. Wieghold, S. et al, J. Phys. Chem. Lett., 2019, 3806-3811.
73. VVieghold, S. et al, J. Phys. Chem. Lett., 2020, 11, 601-607.
74. VVieghold, S. et al, Matter, 2019, 1, 705-719.
75. Wolf, E. A.; et al. Phys. Rev. B 2021, 103 (20), L201201. doi: 10.1103/PhysRevB.103.L201201.
76. Wu, M. et al, Applied Physics Letters, 2017, 110, 211101.
77. Wu, M. et al, Nature Photonics, 2016, 10, 31-34.
78. Wu, W. et al, J. Org. Chem., 2011, 76, 7056-7064.
79. Xing, G. et al, Science, 2013, 342, 344-347.
80. Yi, C.; et al. Energy Environ. Sci. 2016, 9 (2), 656-662. doi: 10.1039/C5EE03255E.
81. Zhong, F. et al, Dyes and Pigments, 2017, 136, 909-918.

What is claimed is:

1. A system for near infrared-to-green upconversion of light in a solid-state optoelectronic device, the system comprising a bulk semiconductor layer capable of absorbing a near-infrared first wavelength of light and an organic annihilator in contact with the bulk semiconductor, wherein the organic annihilator is capable of upconversion via triplet-triplet annihilation from triplet states in the organic annihilator to produce green light at a second wavelength, and wherein the organic annihilator comprises a derivative of a polycyclic aromatic hydrocarbon (PAH) selected from 1-chloro-9,10-bis(phenylethynyl) anthracene (1-CBPEA), naphtho[2,3-a]pyrene (NaPy), or a combination thereof.

2. The system according to claim 1, wherein exposing the bulk semiconductor to light at the first wavelength creates free charge carriers by promoting electrons from a valence band of the bulk semiconductor to a conduction band of the bulk semiconductor, resulting in holes in the valence band.

3. The system according to claim 2, wherein the triplet states of the organic annihilator are capable of being populated by charge transfer from the free charge carriers generated in the bulk semiconductor.

4. The system according to claim 1, wherein the first wavelength is between about 650 nm and about 1200 nm.

5. The system according to claim 1, wherein the system comprises a bilayer device comprising a bulk semiconductor layer in contact with an organic annihilator layer.

6. The system of claim 5, wherein upconversion occurs at or within 100 nm of an interface between the bulk semiconductor layer and the organic annihilator layer.

7. The system according to claim 1, wherein the bulk semiconductor comprises an organic or inorganic metal halide perovskite, a cadmium telluride, an indium phosphide, an indium gallium arsenide, a cadmium indium gallium selenide, a transition metal dichalcogenide, or a combination thereof.

8. The system according to claim 7, wherein the organic metal halide perovskite comprises a methylammonium-based metal halide perovskite, a formamidinium-based metal halide perovskite, a cesium-based metal halide perovskite, or a combination thereof.

9. The system according to claim 1, wherein the bulk semiconductor comprises a bandgap of from about 1.0 eV to about 1.9 eV.

10. The system according to claim 1, wherein the first wavelength is from about 200 nm to about 400 nm greater than the second wavelength.

11. The system according to claim 1, wherein the bulk semiconductor has a bandgap within about 10% of a lowest triplet energy of the organic annihilator, and wherein the lowest triplet energy of the organic annihilator is from about 1.7 to about 1.15 eV.

12. The system according to claim 1, wherein the organic annihilator is substantially free of a guest (emitter) material.

13. A device comprising the system of claim 1, wherein the device comprises a solar cell, a sensor, a light-emitting diode, or any combination thereof.

14. A method for upconverting near infrared light to green light, the method comprising:
   (a) exposing a bulk semiconductor layer to a near-infrared first wavelength of light; and
   (b) upconverting the near-infrared light in an organic annihilator in contact with the bulk semiconductor to green light at a second wavelength;
   wherein the first wavelength is between about 650 nm and about 1200 nm;
   wherein the first wavelength is from about 200 nm to about 400 nm greater than the second wavelength; and
   wherein the organic annihilator comprises a derivative of a polycyclic aromatic hydrocarbon (PAH) selected from 1-chloro-9,10-bis(phenylethynyl) anthracene (1-CBPEA), naphtho[2,3-a]pyrene (NaPy), or a combination thereof.

15. The method according to claim 14, wherein the bulk semiconductor comprises an organic or inorganic metal halide perovskite, a cadmium telluride, an indium phosphide, an indium gallium arsenide, a cadmium indium gallium selenide, a transition metal dichalcogenide, or a combination thereof.

16. The method according to claim 15, wherein the organic metal halide perovskite comprises a methylammonium-based metal halide perovskite, a formamidinium-based metal halide perovskite, a cesium-based metal halide perovskite, or a combination thereof.

17. The method according to claim 14, wherein the bulk semiconductor comprises a bandgap of from about 1.0 eV to about 1.9 eV.

18. The method according to claim 14, wherein the organic annihilator is substantially free of a guest (emitter) material.

* * * * *